US011946647B2

(12) United States Patent
Park et al.

(10) Patent No.: US 11,946,647 B2
(45) Date of Patent: Apr. 2, 2024

(54) ELECTRIC RANGE

(71) Applicant: LG ELECTRONICS INC., Seoul (KR)

(72) Inventors: Jinwoo Park, Seoul (KR); Junghyeon Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 414 days.

(21) Appl. No.: 17/182,586

(22) Filed: Feb. 23, 2021

(65) Prior Publication Data

US 2021/0289590 A1 Sep. 16, 2021

(30) Foreign Application Priority Data

Mar. 12, 2020 (KR) .................. 10-2020-0030920

(51) Int. Cl.
*F24C 15/00* (2006.01)
*F24C 15/08* (2006.01)
(Continued)

(52) U.S. Cl.
CPC ............ *F24C 15/006* (2013.01); *F24C 15/08* (2013.01); *F24C 15/101* (2013.01); *F24C 15/36* (2013.01); *H05B 6/1209* (2013.01); *H05B 6/1263* (2013.01); *H05K 7/20136* (2013.01); *H05K 7/20145* (2013.01)

(58) Field of Classification Search
CPC ........ F24C 15/006; F24C 15/08; F24C 15/36; F24C 15/2042; F24C 15/101; F24C 15/2035; F24C 15/2057; H05B 6/1209; H05B 6/1263; H05B 2206/022;
(Continued)

(56) References Cited

U.S. PATENT DOCUMENTS 7,049,552 B2 * 5/2006 Arntz ...................... H05B 3/74
219/452.12
9,125,244 B2 * 9/2015 Oagley ................ H05B 6/1263
(Continued)

FOREIGN PATENT DOCUMENTS

CN 205102187 3/2016
CN 205842817 12/2016
(Continued)

OTHER PUBLICATIONS

EP-2498574-A2 (Year: 2012).*
(Continued)

*Primary Examiner* — Chris Q Liu
(74) *Attorney, Agent, or Firm* — KED & ASSOCIATES, LLP

(57) ABSTRACT

An electric range is provided that may include a case; at least one fan configured to cool an inside of the case; at least one first through hole formed on a lower surface of the case and configured to supply air to the at least one fan; and a first cover disposed to encircle the at least one first through hole outside of the lower surface of the case and having a plurality of first slits. The first cover may prevent a foreign substance from contacting the at least one fan. The foreign substance may be an end portion of a user's body, for example, a user's finger. The at least one fan may have no structure for preventing contact of a foreign substance.

10 Claims, 17 Drawing Sheets

(51) Int. Cl.
*F24C 15/10* (2006.01)
*F24C 15/36* (2006.01)
*H05B 6/12* (2006.01)
*H05K 7/20* (2006.01)

(58) Field of Classification Search
CPC .......... H05B 6/062; H05B 6/065; H05B 6/06; H05B 6/685; H05K 7/20136; H05K 7/20145
See application file for complete search history.

(56) References Cited

U.S. PATENT DOCUMENTS

| | | | | |
|---|---|---|---|---|
| 9,612,022 | B2* | 4/2017 | Chiang | F24C 15/2057 |
| 9,841,196 | B2* | 12/2017 | Chavan | F24C 15/101 |
| 2006/0157046 | A1* | 7/2006 | Na | F24C 15/101 |
| | | | | 126/25 R |
| 2008/0142512 | A1* | 6/2008 | Kim | F24C 15/101 |
| | | | | 219/757 |
| 2010/0163549 | A1* | 7/2010 | Gagas | F24C 15/2042 |
| | | | | 219/622 |
| 2010/0219179 | A1* | 9/2010 | Lin | F24C 15/101 |
| | | | | 165/104.31 |
| 2012/0305544 | A1* | 12/2012 | Oagley | H05B 6/1263 |
| | | | | 219/622 |

FOREIGN PATENT DOCUMENTS

| | | | |
|---|---|---|---|
| CN | 207050011 | 2/2018 | |
| CN | 109579158 | 4/2019 | |
| EP | 2498574 A2 * | 9/2012 | .............. H05B 6/12 |
| EP | 2 531 003 | 12/2012 | |
| EP | 3 119 162 | 1/2017 | |
| JP | S59105816 * | 6/1984 | |
| JP | 2007328930 | 12/2007 | |
| JP | 2009-301990 | 12/2009 | |
| JP | 2010-040402 | 2/2010 | |
| KR | 10-2018-0025752 | 3/2018 | |
| WO | WO 2006/025299 | 3/2006 | |
| WO | WO 2018058929 | 4/2018 | |

OTHER PUBLICATIONS

JP S59105816 (Year: 1984).*
European Search Report issued in Application No. 21154703.9 dated Jul. 21, 2021.
Chinese Office Action dated Apr. 24, 2023 issued in Application No. 202110189906.2.

* cited by examiner

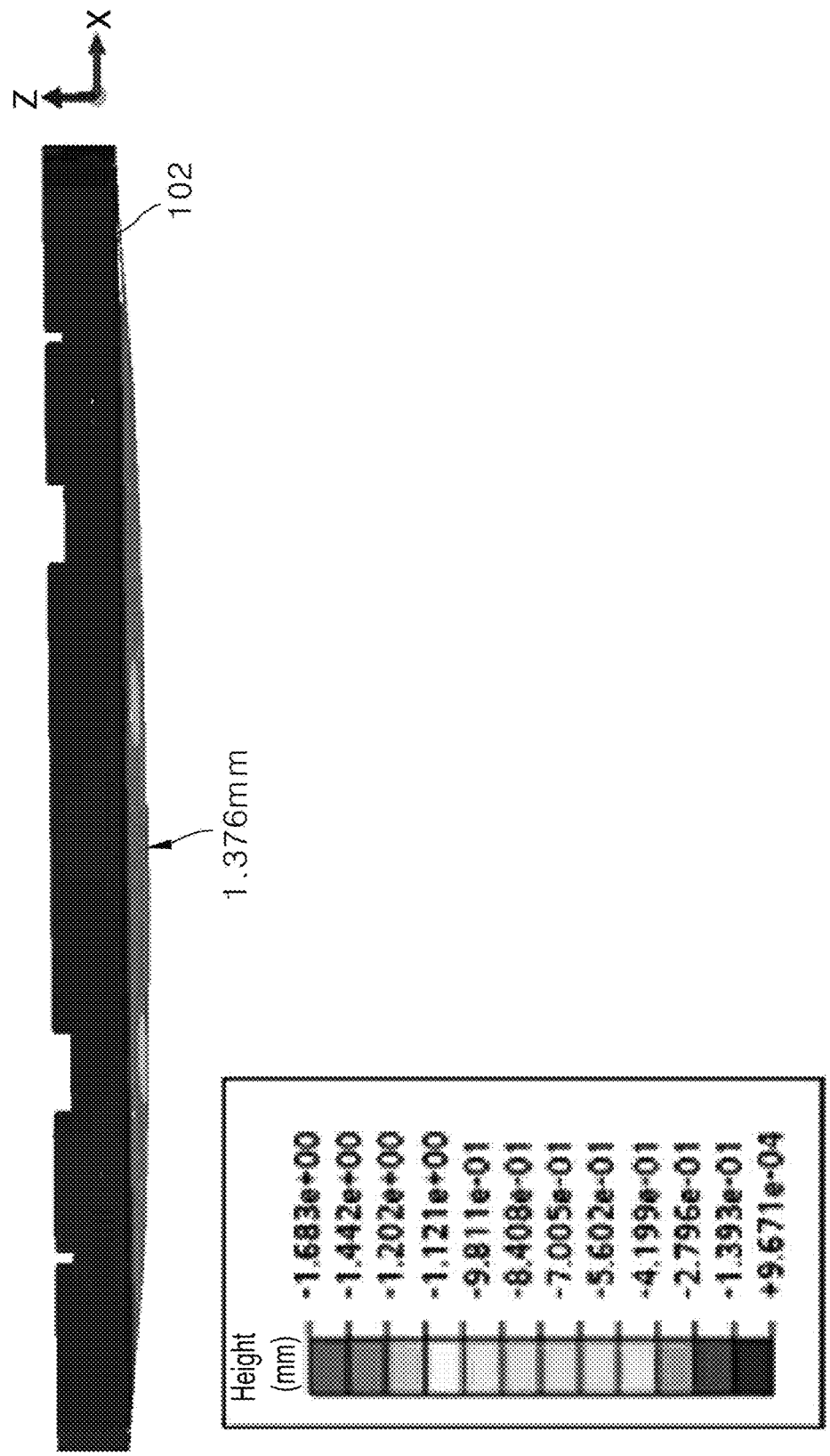

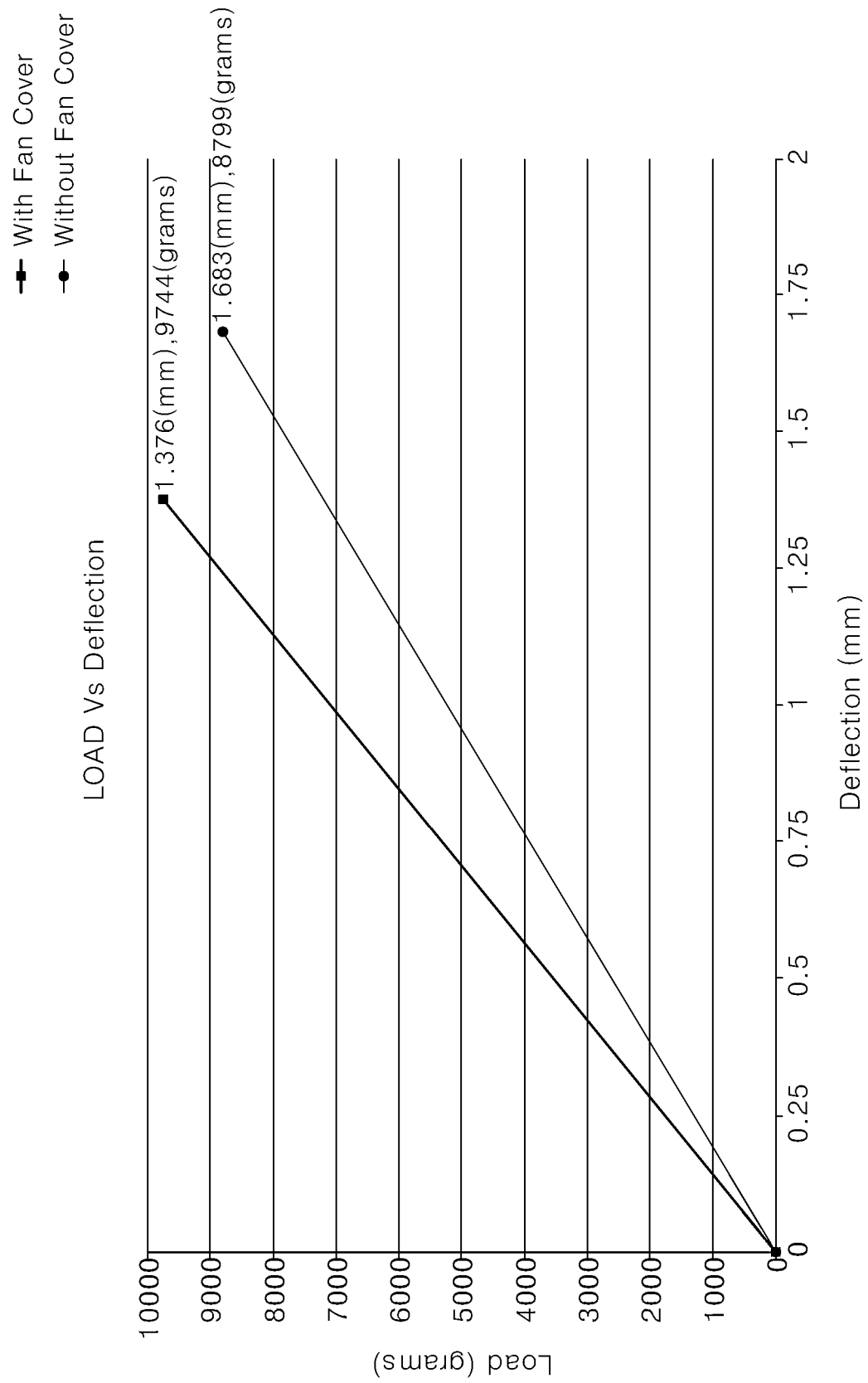

ELECTRIC RANGE

CROSS-REFERENCE TO RELATED APPLICATION(S)

This application claims priority to and the benefit of Korean Patent Application No. 10-2020-0030920, filed in Korea on, Mar. 12, 2020, the disclosure of which is incorporated herein by reference in its entirety.

BACKGROUND

1. Field

An electric range is disclosed herein.

2. Background

Various types of cooking appliances are used to heat food or other items (hereinafter, collectively "food") at homes or restaurants. The cooking appliances include gas ranges using gas and electric ranges using electricity.

The electric ranges are classified as resistance heating-type electric ranges and induction heating-type electric ranges. In a resistance heating method, electric current is supplied to a metallic resistance wire or a non-metallic heat generation element, such as silicon carbide to generate heat, and the generated heat is radiated or conducted to heat an object to be heated, for example, a cooking vessel, such as a pot, or a frying pan, for example. In an induction heating method, high-frequency power is supplied to a coil to generate a magnetic field around the coil, and eddy current produced in the generated magnetic field is used to heat an object to be heated made of a metallic material.

Regarding basic theories of induction heating, when electric current is supplied to a working coil or a heating coil, heat is generated while an object to be heated is inductively heated, and the object to be heated is heated by the generated heat.

An electric range is provided with a drive circuit, for example, a printed circuit board (PCB)) for driving a heating unit and other components. When the heating unit operates, a temperature of the circuit increases. To prevent a fire caused due to an increase in temperature of the circuit, the electric range includes an air blowing fan to lower temperature in the device and cool the circuit.

Additionally, a user's finger may contact the air blowing fan. To prevent this from happening, an air blowing fan of the related art includes a component, such as a grill, for example, for preventing a user's finger from contacting the fan to meet safety standards.

However, noise is made by the grill during driving of the air blowing fan. Further, air, that is, wind, generated by the air blowing fan hits the grill, causing a reduction in air blow efficiency of the air blowing fan.

BRIEF DESCRIPTION OF THE DRAWINGS

Embodiments will be described in detail with reference to the following drawings in which like reference numerals refer to like elements, and wherein:

FIGS. 11A, 11B, 12A, 12B and 13 are views for explaining sagging of a lower surface of a case depending on whether a cover is provided, according to an embodiment.

DETAILED DESCRIPTION

Figure 1:
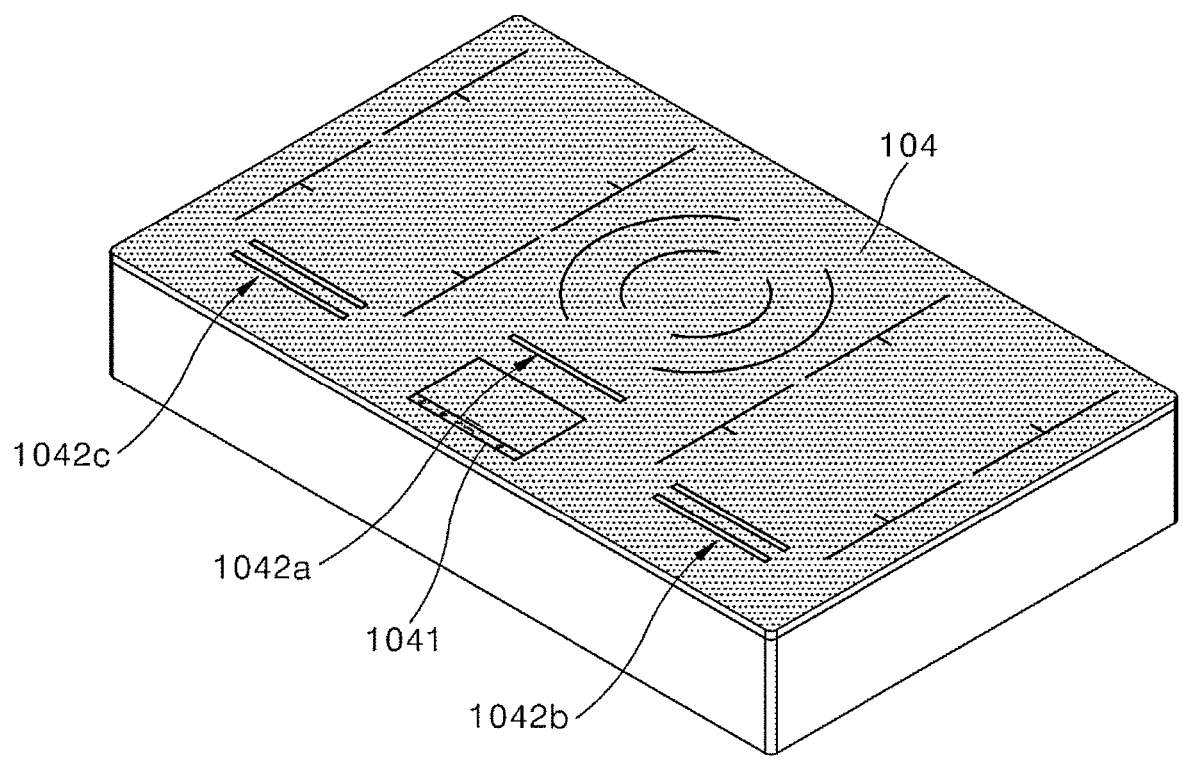
FIG. 1 is a perspective view of an induction heating device according to an embodiment.

Embodiments are described hereinafter with reference to the accompanying drawings such that one having ordinary skill in the art to which the embodiments pertain may easily implement the technical idea. In the disclosure, description of known technologies in relation to the disclosure is omitted if it is deemed to make the gist unnecessarily vague. In the drawings, the same or like reference numerals denote the same or like components.

The terms "first", "second" and the like are used herein only to distinguish one component from another component. Thus, the components should not be limited by the terms. Certainly, a first component can be a second component unless stated to the contrary.

When one component is described as being "in an upper portion (or a lower portion)" of another component, or "on (or under)" another component, one component can be placed on the upper surface (or under the lower surface) of another component, and an additional component may be interposed between another component and one component on (or under) another component.

When one component is described as being "connected", "coupled", or "connected" to another component, one component can be directly connected, coupled or connected to another component; however, it is also to be understood that an additional component can be "interposed" between the two components, or the two components can be "connected", "coupled", or "connected" through an additional component.

Hereinafter, each component may be provided as a single one or a plurality of ones, unless explicitly stated to the contrary.

The singular forms "a", "an" and "the" are intended to include the plural forms as well, unless explicitly indicated otherwise. It should be further understood that the terms "comprise" or "have," set forth herein, are not interpreted as necessarily including all the stated components or steps but can be interpreted as including some of the stated components or steps or can be interpreted as further including additional components or steps.

Hereinafter, the terms "A and/or B" as used herein can denote A, B or A and B, and the terms "C to D" can denote C or greater and D or less, unless stated to the contrary.

Hereinafter, an electric range is described with reference to several embodiments. The electric range disclosed herein may include an electric resistance-type electric range and an induction heating-type electric range, for example, an induction heating device. For convenience, an induction heating device, provided with a working coil as a heating unit, is described as an example during description of the embodiments. However, embodiments are not limited to those set forth herein.

Figure 2:
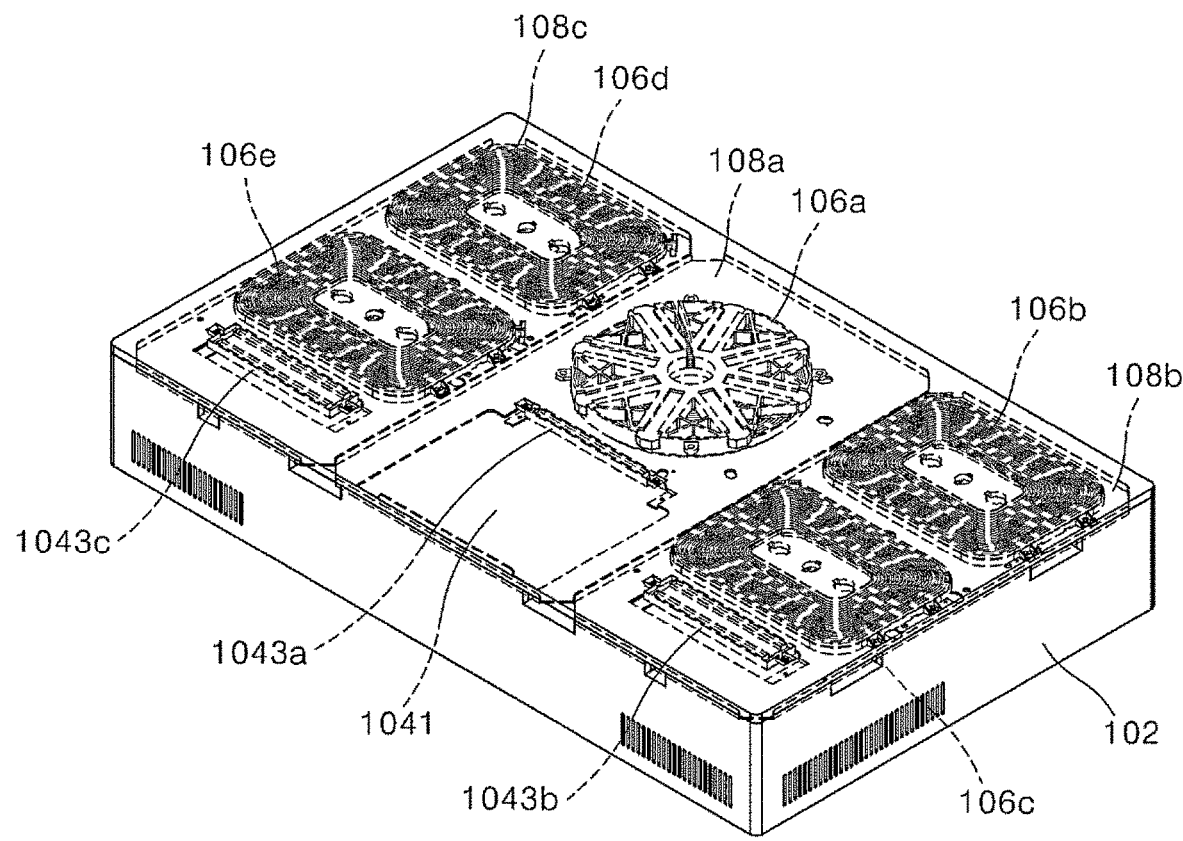
FIGS. 2 to 5 are perspective views of the induction heating device of FIG. 1 without some components.
Figure 3:
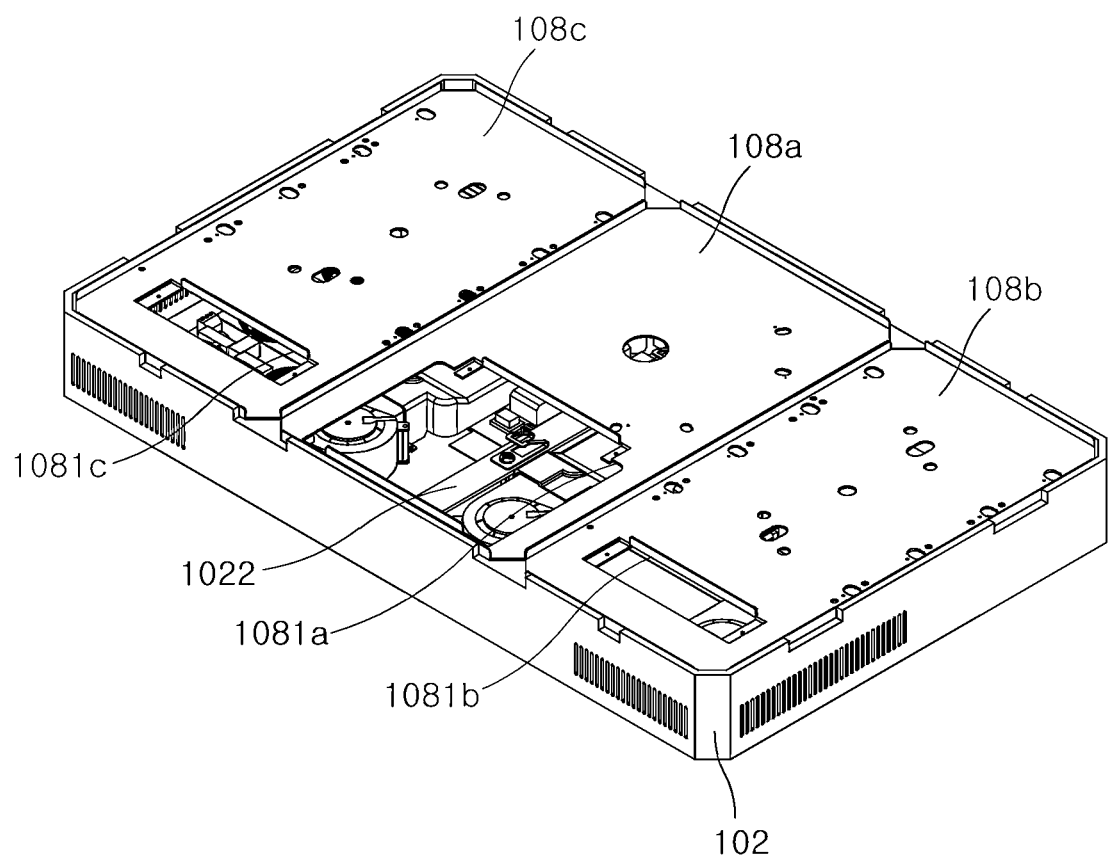
Figure 4:
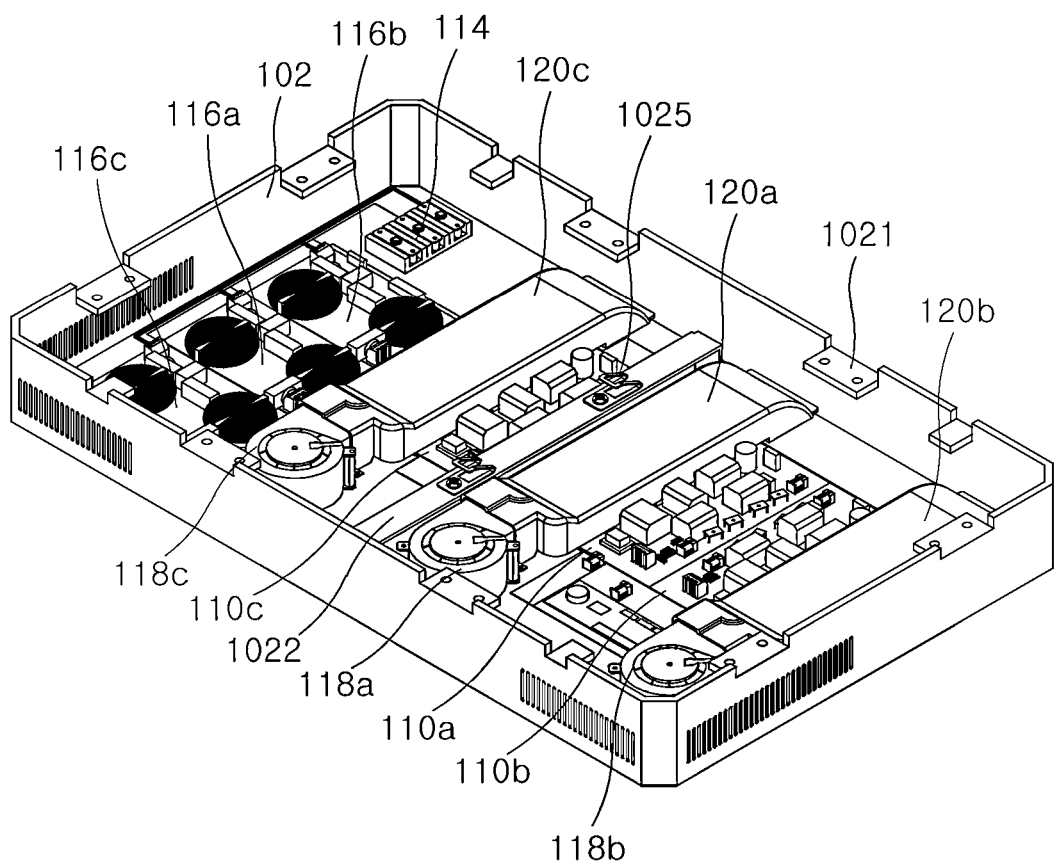
Figure 5:
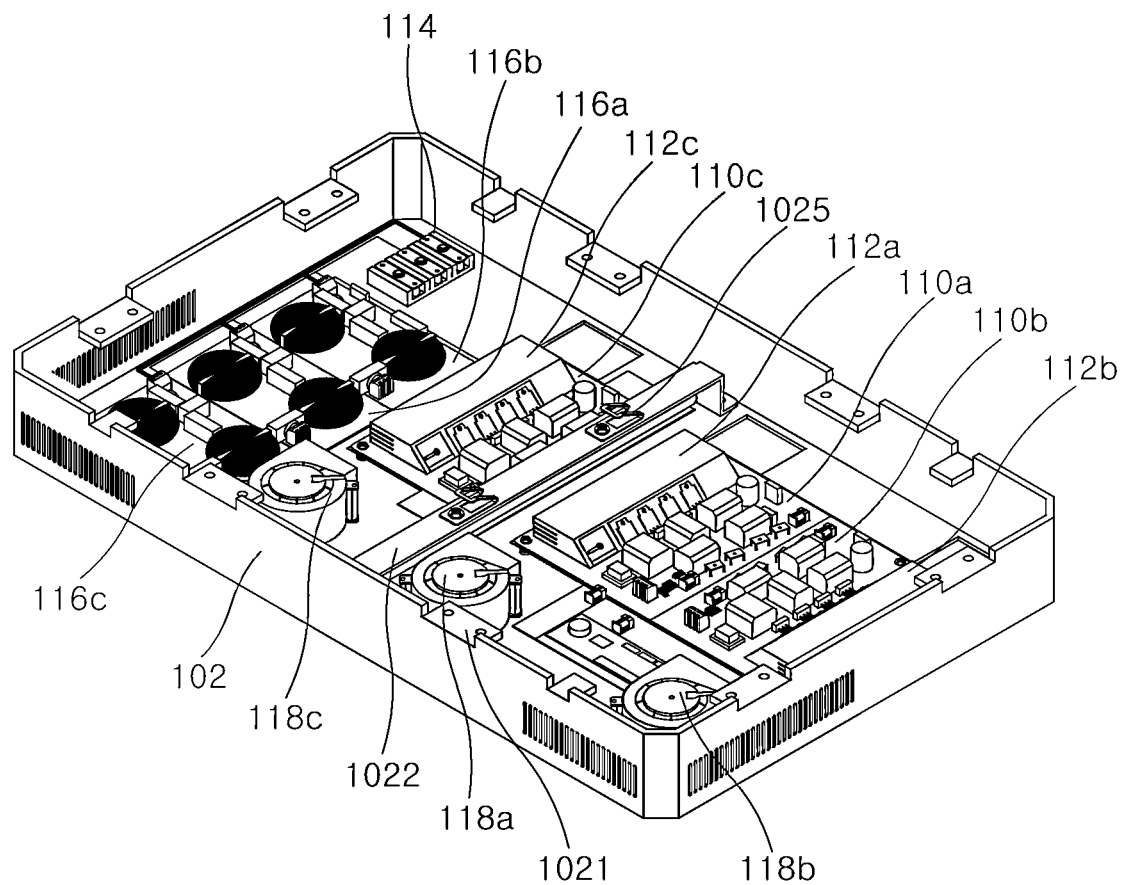

FIG. 1 is a perspective view of an induction heating device 100 according to an embodiment. FIGS. 2 to 5 are perspective views of the induction heating device 100 of FIG. 1 without some components. More specifically, FIG. 2 is a view showing the induction heating device 100 in FIG. 1 without a cover plate 104, FIG. 3 is a view showing the induction heating device 100 in FIG. 1 without the cover plate 104 and working coil 106*a*, 106*b*, 106*c*, 106*d*, 106*e*, FIG. 4 is a view showing the induction heating device 100 in FIG. 1 without the cover plate 104, the working coil 106*a*, 106*b*, 106*c*, 106*d*, 106*e*, and base plate 108*a*, 108*b*, 108*c*, and FIG. 5 is a view showing the induction heating device 100 in FIG. 1 without the cover plate 104, working coil 106*a*, 106*b*, 106*c*, 106*d*, 106*e*, the base plate 108*a*, 108*b*, 108*c*, and an air guide 120*a*, 120*b*, 120*c*.

Referring to FIGS. 1 to 5, the induction heating device 100 according to an embodiment may include a case 102, cover plate 104, working coils 106*a*, 106*b*, 106*c*, 106*d*, 106*e*, base plate 108*a*, 108*b*, 108*c*, a drive circuit 110*a*, 110*b*, 110*c*, a heat sink 112*a*, 112*b*, 112*c*, a power feeder 114, a filter circuit 116*a*, 116*b*, 116*c*, an air blowing fan (fan) 118*a*, 118*b*, 118*c*, and an air guide 120*a*, 120*b*, 120*c*. The case 102 may protect components in the induction heating device 100. For example, the case 102 may be made of aluminum; however, embodiments are not limited thereto. The case 102 may be thermally insulated to prevent heat, generated by the working coil 106*a*, 106*b*, 106*c*, 106*d*, 106*e*, from leaking outward.

The cover plate 104 may be coupled to an upper end of the case 102 to shield an inside of the case 102, and an object to be heated (not illustrated, an object to be heated by one or more working coils 106*a*, 106*b*, 106*c*, 106*d*, 106*e*) may be placed on an upper surface of the cover plate 104.

An object to be heated, such as a cooking vessel, may be placed on the upper surface of the cover plate 104, and heat generated by the working coil 106*a*, 106*b*, 106*c*, 106*d*, 106*e* may be delivered to the object to be heated through the upper surface of the cover plate 104. The cover plate 104 may be made of glass; however, embodiments are not limited thereto.

An input interface 1041 configured to receive an input from a user may be disposed on the upper surface of the cover plate 104. The input interface 1041 may be recessed into the upper surface of the cover plate 104 and may display a specific image. The input interface 1041 may receive a touch input from the user, and the induction heating device 100 may be driven based on the received touch input.

More specifically, the input interface 1041 may be a module for inputting a heating intensity or a heating period, for example, desired by the user, and may be implemented as a physical button or a touch panel, for example. Additionally, the input interface 1041 may display a drive state of the induction heating device 100. For example, the input interface 1041 may be a thin film transistor liquid crystal display (TFT LCD); however, embodiments are not limited thereto.

Light display areas 1042*a*, 1042*b*, 1042*c* may be formed on the upper surface of the cover plate 104. Light source units (lighting units) 1043*a*, 1043*b*, 1043*c* may be disposed below the cover plate 104, and light emitted from the light source units 1043*a*, 1043*b*, 1043*c* may be delivered to the user through the light display areas 1042*a*, 1042*b*, 1042*c*.

The working coil 106*a*, 106*b*, 106*c*, 106*d*, 106*e* may be a heating unit that heats an object to the heated, and may be disposed in the case 102. The working coil 106*a*, 106*b*, 106*c*, 106*d*, 106*e* may include a wire wound multiple times in a ring shape, and may generate an alternating current (AC) magnetic field. Additionally, a mica sheet and a ferrite core may be consecutively disposed at a lower side of the working coil 106*a*, 106*b*, 106*c*, 106*d*, 106*e*.

The ferrite core may be fixed to the mica sheet through a sealant, and may diffuse the AC magnetic field generated by the working coil 106*a*, 106*b*, 106*c*, 106*d*, 106*e*. The mica sheet may be fixed to the working coil 106*a*, 106*b*, 106*c*, 106*d*, 106*e* and the ferrite core through a sealant, and may prevent direct delivery of the heat, generated by the working coil 106*a*, 106*b*, 106*c*, 106*d*, 106*e*, to the ferrite core.

A plurality of working coils 106*a*, 106*b*, 106*c*, 106*d*, 106*e* may be provided. The plurality of working coils 106*a*, 106*b*, 106*c*, 106*d*, 106*e* may include first working coil 106*a* disposed at a central portion of the case 102, second working coil 106*b* and third working coil 106*c* disposed on a right (first) side of the first working coil 106*a*, and a fourth working coil 106*d* and a fifth working coil 106*e* disposed on a left (second) side of the first working coil 106*a*. The second working coil 106*b* and the third working coil 106*c* may be disposed on the right side of the first working coil 106*a* in a frontward-rearward direction, and the fourth working coil 106*d* and the fifth working coil 106*e* may be disposed on the left side of the first working coil 106*a* in the frontward-rearward direction.

For example, the first working coil 106*a* may be a high-output dual heating coil, and the second working coil 106*b*, the third working coil 106*c*, the fourth working coil 106*d*, and the fifth working coil 106*e* may each be a single heating coil. The first working coil 106*a* as a dual heating coil has a heavy weight, and may have a maximum output of 7000 kW.

The induction heating device 100 according to an embodiment may perform the function of wireless power transmission based on configurations and features described above. Technologies for wirelessly supplying power have been developed and have been used for a wide range of electronic devices. A battery of an electronic device, to which the wireless power transmitting technology is applied, can be charged only by being placed on a charge pad without connecting to an additional charge connector. Accordingly, the electronic device, to which the wireless power transmitting technology is applied, requires no cord or no charger, thereby ensuring improved mobility and a reduced size and weight.

The wireless power transmitting technology can be broadly classified as an electromagnetic induction technology using a coil, a resonance technology using resonance, and a radio emission technology for converting electric energy into microwaves and delivering the microwaves, for example. In the electromagnetic induction technology, power is transmitted using electromagnetic induction between a primary coil, that is, a working coil, included in an apparatus for wirelessly transmitting power and a secondary coil included in an apparatus for wirelessly receiving power.

The theory of the induction heating technology of the induction heating device 100 is substantially the same as that of the electromagnetic induction-based wireless power transmission technology, in that an object to be heated is heated using electromagnetic induction. Accordingly, the induction heating device 100 according to an embodiment may perform the function of wireless power transmission, as well as the function of induction heating.

The base plate 108*a*, 108*b*, 108*c* may be disposed at an end of the case 102, and the plurality of working coils 106*a*, 106*b*, 106*c*, 106*d*, 106*e* may be disposed in an upper portion of the base plate 108*a*, 108*b*, 108*c*. The base plate 108*a*, 108b, 108c may support the plurality of working coils 106a, 106b, 106c, 106d, 106e which are heavy, and may help the plurality of working coils 106a, 106b, 106c, 106d, 106e to be mounted. The input interface 1041 and the light source units 1043a, 1043b, 1043c may be further disposed at the upper portion of the base plate 108a, 108b, 108c.

According to one embodiment, a plurality of base plates 108a, 108b, 108c may be provided; however, embodiments are not limited thereto. Alternatively, a single base plate may be disposed in the case 102.

The plurality of base plates 108a, 108b, 108c may include first base plate 108a, second base plate 108b, and third base plate 108c. The first base plate 108a, the second base plate 108b, and the third base plate 108c may be disposed at the end of the case 102 side by side with each other.

The first base plate 108a may be disposed at a central portion of the end of the case 102. The first working coil 106a may be disposed at an upper portion of the first base plate 108a.

The input interface 1041, and first light source unit 1043a corresponding to the first working coil 106a may be further disposed in the upper portion of the first base plate 108a. The first base plate 108a may have a through hole 1081a for installing the input interface 1041 and the first light source unit 1043a.

The second base plate 108b may be disposed on a right (first) side of the first base plate 108a at the end of the case 102. The second working coil 106b and the third working coil 106c may be disposed at an upper portion of the second base plate 108b.

A second light source unit 1043b corresponding to the second working coil 106b and the third working coil 106c may be further disposed in the upper portion of the second base plate 108b. In the upper portion of the second base plate 108b, the second working coil 106b, the third working coil 106c, and the second light source unit 1043b may be consecutively disposed. The second base plate 108b may have a through hole 1081b for installing the second light source unit 1043b.

The third base plate 108c may be disposed on a left (second) side of the first base plate 108a at the end of the case 102. The fourth working coil 106d and the fifth working coil 106e may be disposed at an upper portion of the third base plate 108c.

A third light source unit 1043c corresponding to the fourth working coil 106d and the fifth working coil 106e may be further disposed at the upper portion of the third base plate 108c. In the upper portion of the third base plate 108c, the fourth working coil 106d, the fifth working coil 106e, and the third light source unit 1043c may be consecutively disposed. The third base plate 108c may have a through hole 1081c for installing the third light source unit 1043c.

The case 102 may have a plurality of mounting portions 1021 to mount the plurality of base plates 108a, 108b, 108c at an outer circumferential surface of the case 102. That is, edges of the plurality of base plates 108a, 108b, 108c may be mounted onto a top of the plurality of mounting portions 1021. Accordingly, the plurality of base plates 108a, 108b, 108c may be disposed at the end of the case 102.

The case 102 may include a bracket 1022 at a central portion of a lower surface (bottom surface) or of a lower end of the case 102. The bracket 1022 may be disposed at a central portion of a lower side of the first base plate 108a, and may prevent a sagging of the lower surface of the first base plate 108a, caused by a weight of the first base plate 108a. The weight of the first base plate 108a may include a weight of the first working coil 106a in the upper portion the first base plate 108a. The second and third base plate 108c and 108b located at outer sides of the electric range may be supported by the mounting portions 1021 respectively at two edges facing each other as well as along one edge connecting these two edges. However, the first base plate 108a located in or at a center of the electric range, that is, between the second and third base plates 108b and 108c, may be supported by the mounting portions 1021 at two edges facing each other, while edges connecting the two edges remain unsupported. For this reason, it is advantageous to provide additional support of the first base plate 108a by means of the bracket 1022.

The bracket 1022 may include at least one elastic element 1025 on a top of the bracket 1022. For example, the elastic element 1025 may be a leaf spring. An upper end of at least one elastic element 1025 may contact the lower surface of the first base plate 108a, and may prevent a sagging of the lower surface of the first base plate 108a.

The drive circuit 110a, 110b, 110c may control driving of the plurality of working coils 106a, 106b, 106c, 106d, 106e which are heating units, and may further control driving of components, such as an input interface 1041, for example, of the induction heating device 100. The drive circuit 110a, 110b, 110c may include various components in relation to the driving of the working coils 106a, 106b, 106c, 106d, 106e. The components may include a power supply configured to supply AC power, a rectifier configured to rectify AC power of the power supply into direct current (DC) power, an inverter configured to convert DC power, rectified by the rectifier, into resonance current as a result of a switching operation and supply the resonance current to the working coil 106, a microcomputer, for example, a micom, configured to control the inverter and components in relation to driving of the inverter, and a relay or a semiconductor switch configured to turn on or turn off the working coils 106a, 106b, 106c, 106d, 106e, for example.

The drive circuit 110a, 110b, 110c may include first drive circuit 110a, second drive circuit 110b, and third drive circuit 110c. The first drive circuit 110a may be disposed on a right (first) side of a lower end of the case 102 with respect to the bracket 1022 and may control driving of the first working coil 106a. The second drive circuit 110b may be disposed on the right side of the first drive circuit 110a and may control driving of the second working coil 106b and the third working coil 106c. The third drive circuit 110c may be disposed on a left (second) side of the lower end of the case 102 with respect to the bracket 1022 and may control driving of the fourth working coil 106d and the fifth working coil 106e.

The heat sink 112a, 112b, 112c may be disposed in or at upper portions of the drive circuits 110a, 110b, 110c and may prevent an increase in temperature of components disposed at the drive circuits 110a, 110b, 110c. The heat sink 112a, 112b, 112c may include first heat sink 112a, second heat sink 112b, and third heat sink 112c. The first heat sink 112a may prevent an increase in temperature of components installed at the first drive circuit 110a, the second heat sink 112b may prevent an increase in temperature of components installed at the second drive circuit 110b, and the third heat sink 112c may prevent an increase in temperatures of components installed at the third drive circuit 110c.

The power feeder 114 may supply an external power source to the induction heating device 100. The power feeder 114 may be implemented as a terminal block, for example.

The power feeder 114 may be disposed at any one of edges of the lower end of the case 102. For example, the power feeder 114 may be disposed at an upper end of the left side of the lower end of the case 102.

The filter circuit 116a, 116b, 116c may be disposed at any one of the edges of the lower end of the case 102, and may reduce noise made by the plurality of working coils 106a, 106b, 106c, 106d, 106e. The filter circuit 116a, 116b, 116c may include first filter circuit 116a, second filter circuit 116b, and third filter circuit 116c.

The first filter circuit 116a may reduce noise made by the first working coil 106a. The second filter circuit 116b may reduce noise made by the second working coil 106b and the third working coil 106c. The third filter circuit 116c may reduce noise made by the fourth working coil 106d and the fifth working coil 106e.

The air blowing fan 118a, 118b, 118c may reduce a temperature inside of the case 102. Accordingly, the air blowing fan 118a, 118b, 118c may lower a temperature of various components installed in or on the drive circuits 110a, 110b, 110c.

The air blowing fan 118a, 118b, 118c may include first air blowing fan 118a, second air blowing fan 118b, and third blow fan 118c. The first air blowing fan 118a may cool various components installed in or on the first drive circuit 110a and may further cool the first light source unit 1043a and the input interface 1041. More particularly, the first air blowing fan 118a may deliver air (wind) for cooking to the first heat sink 112a in or at an upper portion of the first drive circuit 110a.

The second air blowing fan 118b may cool various components installed in or on the second drive circuit 110b and may further cool the second light source unit 1043b. More particularly, the second air blowing fan 118b may deliver air for cooling to the second heat sink 112b in or at an upper portion of the second drive circuit 110b.

The third air blowing fan 118c may cool various components installed in or on the third drive circuit 110c and may further cool the third light source unit 1043c. More particularly, the third air blowing fan 118c may deliver air for cooling to the third heat sink 112c in or at an upper portion of the third drive circuit 110c.

The air blowing fans 118a, 118b, 118c may not include structure for preventing a foreign substance from contacting the air blowing fans 118a, 118b, 118c.

The air guide 120a, 120b, 120c may guide air generated by the air blowing fans 118a, 118b, 118c. The air guide 120a, 120b, 120c may include first air guide 120a, second air guide 120b, and third guide 120c.

The first air guide 120a may be disposed to encircle the first heat sink 112a installed at the first drive circuit 110a and may guide (deliver) air, output from the first air blowing fan 118a, to the first heat sink 112a. The second air guide 120b may be disposed to encircle the second heat sink 112b installed at the second drive circuit 110b and may guide air, output from the second air blowing fan 118b, to the second heat sink 112b. The third air guide 120c may be disposed to encircle the third heat sink 112c installed at the third drive circuit 110c and may guide air, output from the third air blowing fan 118c, to the third heat sink 112c.

The induction heating device 100 according to an embodiment has the configurations and features described above. Hereinafter, configurations of the induction heating device 100 that may reduce noise made by the air blowing fans 118a, 118b, 118c, maximize air blowing efficiency, meet safety standards and complement rigidity of a lower surface of the case 102 are specifically described.

Figure 6:
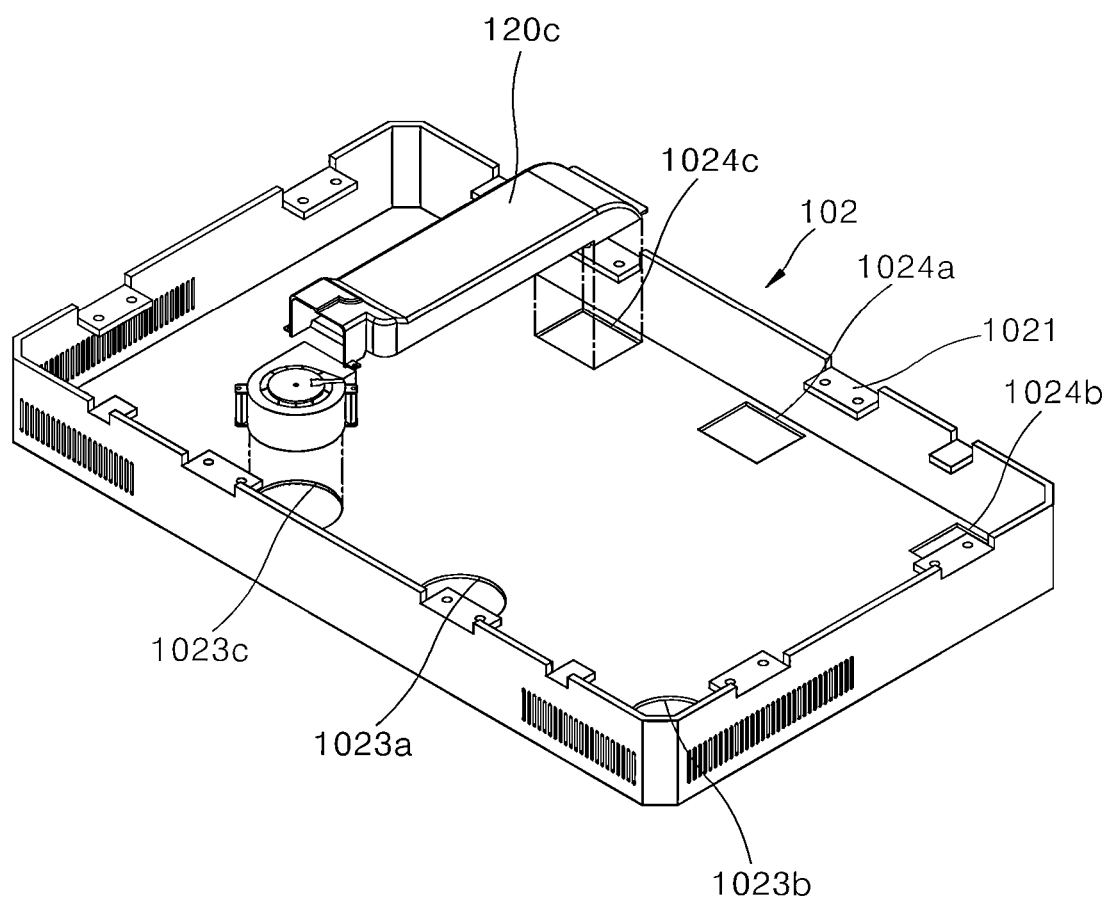
FIG. 6 is a plane view of a case according to an embodiment, viewed from the top.
Figure 7:
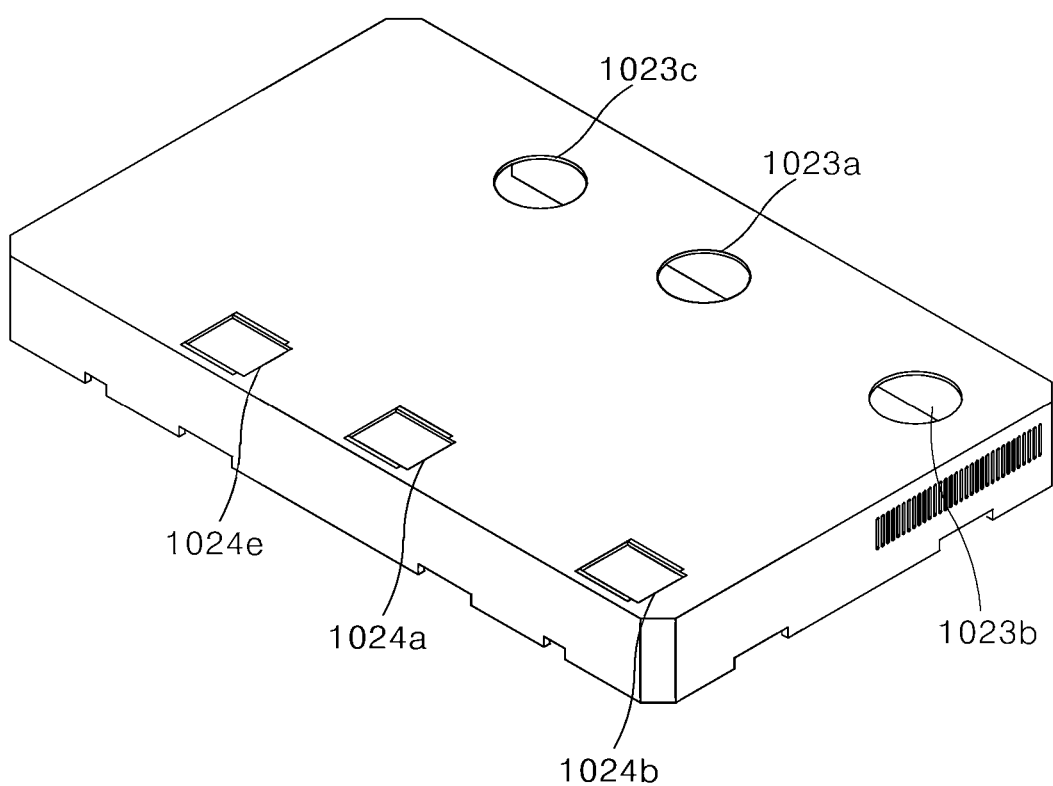
FIG. 7 is a plane view of a case according to an embodiment, viewed from the bottom.
Figure 8:
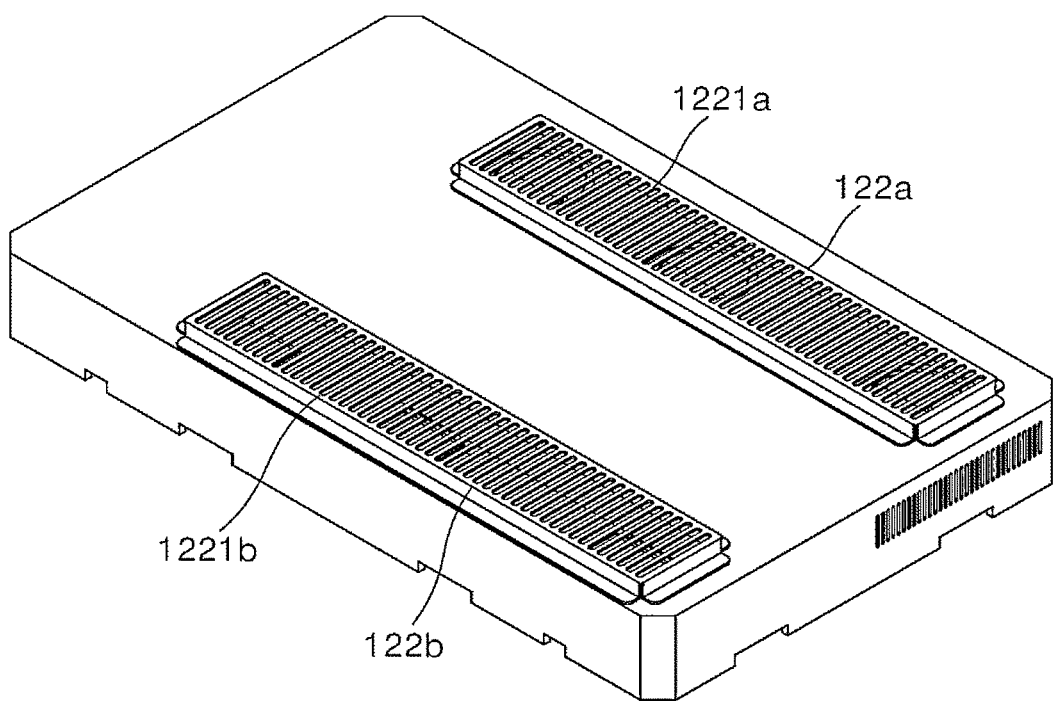
FIG. 8 is a perspective view of a case, coupled to a cover and viewed from the bottom, according to an embodiment.
Figure 9:
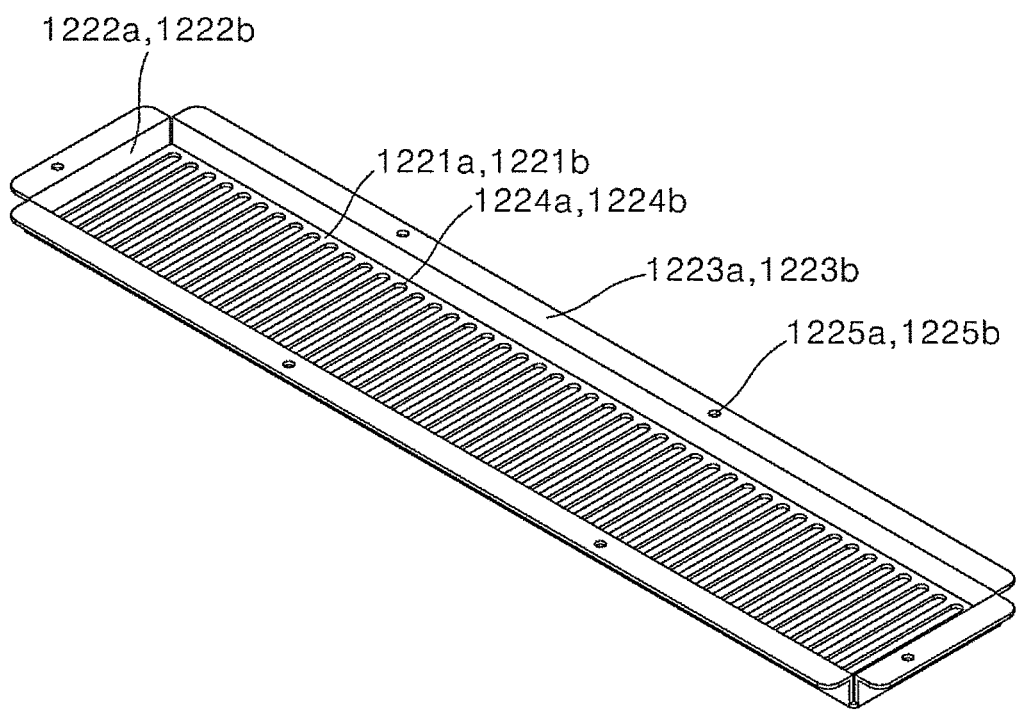
FIG. 9 is a perspective view showing a cover according to an embodiment.

FIG. 6 is a perspective view of case 102 according to an embodiment, viewed from the top. FIG. 7 is a plane view of case 102 according to an embodiment, viewed from the bottom. FIG. 8 is a perspective view of case 102, coupled to cover 122a, 122b and viewed from the bottom, according to an embodiment. FIG. 9 is a perspective view of cover 122a, 122b according to an embodiment. For convenience of description, FIG. 6 shows only one way in which the third air guide 120c may be disposed in the upper portion of the third drive circuit 110c in the case 102.

Configurations of the induction heating device 100 are described with reference to the drawings, hereinafter.

A first through hole 1023a, 1023b, 1023c and a second through hole 1024a, 1024b, 1024c may be formed at the lower end of the case 102. The case 102 may have a shape in which the lower end of the case 102 is closed except for the first through hole 1023a, 1023b, 1023c and the second through hole 1024a, 1024b, 1024c.

The first through hole 1023a, 1023b, 1023c may serve as a passage through which air may be supplied to the air blowing fans 118a, 118b, 118c. The first through hole 1023a, 1023b, 1023c may be formed on the lower surface of the case 102 near lower ends of the air blowing fans 118a, 118b, 118c. Accordingly, air may be supplied to the air blowing fans 118a, 118b, 118c.

The first through hole 1023a, 1023b, 1023c may be formed on one or a first side of the lower surface of the case 102. That is, the first through hole 1023a, 1023b, 1023c may be formed at an edge of one side of the case 102.

A number of the first through holes 1023a, 1023b, 1023c may be the same as that of the air blowing fans 118a, 118b, 118c. That is, a (1-1)th through hole 1023a may provide a passage through which air is supplied to the first air blowing fan 118a, a (1-2)th through hole 1023b may provide a passage through which air is supplied to the second air blowing fan 118b, and a (1-3)th through hole 1023c may provide a passage through which air is supplied to the third air blowing fan 118c. The (1-1)th through hole 1023a, (1-2)th through hole 1023b, and (1-3)th through hole 1023c may be disposed side by side at the edge of the one side of the case 102.

The first through hole 1023a, 1023b, 1023c may have a shape corresponding to a shape of a lower surface of the air blowing fan 118a, 118b, 118c. That is, the shape of the first through hole 1023a, 1023b, 1023c may be the same as a shape of a fan in the air blowing fan 118a, 118b, 118c; however, embodiments are not limited thereto.

The second through hole 1024a, 1024b, 1024c may serve as a passage through which air output from the air blowing fan 118a, 118b, 118c may be discharged out of the case 102. That is, air in the case 102 may be discharged outward through the second through hole 1024a, 1024b, 1024c.

As described above, the air guides 120a, 120b, 120c configured to guide air generated by the air blowing fans 118a, 118b, 118c may be disposed at the lower end of the case 102. One (first) end of the air guide 120a, 120b, 120c may be disposed near the air blowing fan 118a, 118b, 118c, and the other (second) end of the air guide 120a, 120b, 120c may contact and connect to the lower surface of the case 102.

The second through hole 1024a, 1024b, 1024c may be formed on the other or a second side of the lower surface of the case 102. That is, the second through hole 1024a, 1024b, 1024c may be formed at an edge of the other side of the case 102. The second through hole 1024a, 1024b, 1024c may be connected to the other end of the air guide 120a, 120b, 120c, and accordingly, air may be discharged out of the case 102. The second through hole 1024a, 1024b, 1024c may have a shape corresponding to a shape of the other end of the air guide 120a, 120b, 120c. That is, the shape of the second through hole 1024a, 1024b, 1024c may be the same as that of the other end of the air guide 120a, 120b, 120c.

A number of the second through holes 1024a, 1024b, 1024c may be the same as that of the air guides 120a, 120b, 120c. A (2-1)th through hole 1024a may connect to the first air guide 120a and provide a passage through which air is discharged, a (2-2)th through hole 1024b may connect to the second air guide 120b and provide a passage through which air is discharged, and a (2-3)th through hole 1024c may connect to the third air guide 120a and provide a passage through which air is discharged. The (2-1)th through hole 1024a, (2-2)th through hole 1024b, and (2-3)th through hole 1024c may be disposed side by side at the edge of the other side of the case 102.

A first cover 122a may be disposed outside of the lower surface of the case 102 and disposed to cover or encircle the first through holes 1023a, 1023b, 1023c. The first cover 122a may be coupled to the lower surface or bottom surface of the case 102 and cover the first through holes 1023a, 1023b, 1023c. That is, the first cover 122a may be disposed to cover or encircle the (1-1)th through hole 1023a, (1-2)th through hole 1023b, and (1-3)th through hole 1023c disposed side by side at the edge of the one side of the case 102. The first cover 122a may include a plurality of first slits 1224a. The first cover 122a may be made of aluminum for example; however, embodiments are not limited thereto.

More specifically, the first cover 122a may include a first slit portion 1221a including a plurality of first slits 1224a, a plurality of first extended portions 1222a and a plurality of first bent portions 1223a. The first extended portions 1222a may extend respectively from an edge of the first slit portion 1221a, for example, by forming an angle, for example, 90°, therewith. Likewise the first bent portions 1223a may extend respectively from one of the first extended portions 1222a, for example, by forming an angle, for example, 90°, therewith.

The first slit portion 1221a may be provided therein with the plurality of first slits 1224a. The first slit portion 1221a may be disposed to face the lower surface of the case 102 and may have a rectangular shape. The plurality of first slits 1224a may have a same shape and may be disposed side by side in the first slit portion 1221a.

The plurality of first slits 1224a may prevent a foreign substance from contacting the air blowing fans 118a, 118b, 118c. The foreign substance may be an end portion of a user's body, for example, a user's finger. That is, the plurality of first slits 1224a may prevent a user's finger from coming into contact with the air blowing fans 118a, 118b, 118c. Accordingly, the plurality of first slits 1224a may have a width less than a width of a user's finger, for example.

The plurality of first extended portions 1222a may extend from a plurality of ends of the first slit portion 1221a in a heightwise direction. In the case of a first slit portion 1221a having a rectangular shape, the plurality of first extended portions 1222a may include a first left extended portion that extends from a left (first) lateral end of the first slit portion 1221a in the heightwise direction, a first right extended portion that extends from a right (second) lateral end of the first slit portion 1221a in the heightwise direction, a first upper extended portion that extends from an upper end or top surface of the first slit portion 1221a in the heightwise direction, and a first lower extended portion that extends from a lower end or bottom surface of the first slit portion 1221a in the vertical, that is, heightwise, direction. The plurality of first extended portions 1222a may have a same height. The top surface of the first slit portion 1221a may face towards an inside of the electric range, while the bottom surface of the first slit portion 1221a may face towards an outside of the electric range.

The plurality of first bent portions 1223a may be bent, for example, a 90-degree bend, at each of the plurality of first extended portions 1222a. The plurality of first bent portions 1223a may be disposed in contact with an outside of the lower surface of the case 104. In the case of a first slit portion 1221a having a rectangular shape, the plurality of first bent portions 1223a may include a first left bent portion bent from the first left extended portion toward an outside of the first slit portion 1221a, a first right bent portion bent from the first right extended portion toward the outside of the first slit portion 1221a, a first upper bent portion bent from the first upper extended portion toward the outside of the first slit portion 1221a, and a first lower bent portion bent from the first lower extended portion toward the outside of the first slit portion 1221a.

The plurality of first bent portions 1223a may connect to the lower end or surface of the case 102. Each of the plurality of first bent portions 1223a may include at least one first coupling hole 1225a, and the plurality of first bent portions 1223a may be, for example, screw-coupled to the lower surface of the case 102.

A second cover 122b may be disposed outside of the lower surface of the case 102 and disposed to encircle the second through hole 1024a, 1024b, 1024c. That is, the second cover 122b may be disposed to encircle the (2-1)th through hole 1024a, (2-2)th through hole 1024b, and (2-3)th through hole 1024c disposed side by side at the edge of the other side of the case 102. Additionally, the second cover 122b may include a plurality of second slits 1224b. The second cover 122b may be made of aluminum, for example, however, embodiments are not limited thereto. The second cover 122b may have a same configuration as the first cover 122a.

More specifically, the first cover 122a may include first slit portion 1221a, a plurality of first extended portions 1222a, and a plurality of first bent portions 1223a. The first slit portion 1221a may be provided therein with the plurality of first slits 1224a. The first slit portion 1221a may be disposed to face the lower surface of the case 102 and may have a rectangular shape.

The second cover 122b may include second slit portion 1221b, a plurality of second extended portions 1222b, and a plurality of second bent portions 1223b. The second slit portion 1221b may be provided therein with the plurality of second slits 1224b. The second slit portion 1221b may be disposed to face the lower surface of the case 102 and may have a rectangular shape. The plurality of second slits 1224b may have a same shape and may be disposed side by side in the second slit portion 1221b.

The plurality of second slits 1224b may also prevent a foreign substance from contacting the air blowing fans 118a, 118b, 118c. That is, the plurality of second slits 1224b may prevent a user's finger from coming into the air blowing fans 118a, 118b, 118c. Accordingly, the plurality of second slits 1224b may have a width less than a width of a user's finger, for example.

The plurality of second extended portions 1222b may extend from a plurality of ends of the second slit portion 1221b in the heightwise direction. In the case of a second slit portion 1221b having a rectangular shape, the plurality of second extended portions 1222b may include a second left extended portion extended from a left (first) lateral end of the second slit portion 1221b in the heightwise direction, a second right extended portion that extends from a right (second) lateral end of the second slit portion 1221b in the heightwise direction, a second upper extended portion that extends from an upper end or top surface of the second slit portion 1221b in the heightwise direction, and a second lower extended portion that extends from a lower end or bottom surface of the second slit portion 1221b in the heightwise direction. The plurality of second extended portions 1222b may have a same height.

The plurality of second bent portions 1223b may be bent, for example, a 90-degree bend, at each of the plurality of second extended portions 1222b. The plurality of second bent portions 1223b may be disposed in contact with the outside of the lower surface of the case 104. In the case of a second slit portion 1221b having a rectangular shape, the plurality of second bent portions 1223b may include a second left bent portion bent from the second left extended portion toward an outside of the second slit portion 1221b, a second right bent portion bent from the second right extended portion toward the outside of the second slit portion 1221b, a second upper bent portion bent from the second upper extended portion toward the outside of the second slit portion 1221b, and a second lower bent portion bent from the second lower extended portion toward the outside of the second slit portion 1221b.

The plurality of second bent portions 1223b may connect to the lower surface of the case 102. Each of the plurality of second bent portions 1223b may include at least one second coupling hole 1225b, and the plurality of second bent portions 1223b may be, for example, screw-coupled to lower surface of the case 102.

The first cover 122a may be disposed at an edge of one (first) side of the lower surface of the case 102, and the second cover 122b may be disposed at an edge of the other (second) side of the lower surface of the case 102. The first cover 122a and the second cover 122b may be disposed to face each other.

The first cover 122a and the second cover 122b may have a same height. The number of the first through holes 1023a, 1023b, 1023c may be the same as the number of the second through holes 1024a, 1024b, 1024c. The (2-1)th through hole 1024a, the (2-2)th through hole 1024b, and the (2-3)th through hole 1024c may be respectively disposed to face the (1-1)th through hole 1023a, the (1-2)th through hole 1023b, and the (1-3)th through hole 1023c corresponding thereto.

Hereinafter, configurations of the induction heating device 100 according to an embodiment are compared with configurations of a related art induction heating device.

An air blowing fan in the induction heating device of the related art includes a structure, that is, a grill for preventing a user's finger from contacting the air blowing fan. When the air blowing fan is driven, the grill included in, that is, mounted on, the air blowing fan makes noise, causing inconvenience to the user.

However, the induction heating device 100 according to embodiments disclosed herein may use the air blowing fan 118a, 118b, 118c without grill. Accordingly, there is no noise made by a grill. Thus, noise generated during operation of the induction heating device 100 may be reduced. In embodiments disclosed herein, a cover with a slit portion may be mounted on the case instead of using an air blowing fan having a grill. This structure considerably reduces noise generation.

In the air blowing fan of the induction heating device of the related art, air hits the grill and is not easily supplied to the air blowing fan. However, the induction heating device 100 according to embodiments disclosed herein may use the air blowing fan 118a, 118b, 118c including no grill, and the first through hole 1023a, 1023b, 1023c may be formed on the lower surface of the case 102. Accordingly, there is no grill hit by air, and air may be efficiently delivered to the air blowing fan 118a, 118b, 118c through the first through hole 1023a, 1023b, 1023c. According to embodiments disclosed herein, a cover with a slit portion may be mounted on the case to cover the through holes instead of using an air blowing fan having a grill. This structure reduces air flow resistance of air to be supplied to the air blowing fan. That is, the induction heating device 100 according to embodiments disclosed herein may maximize air blowing efficiency.

A concept of maximizing air blowing efficiency of the induction heating device 100 according to an embodiment is described hereinafter with reference to Table 1 and FIGS. 10A, 10B and 10C below.

Figure 10A:
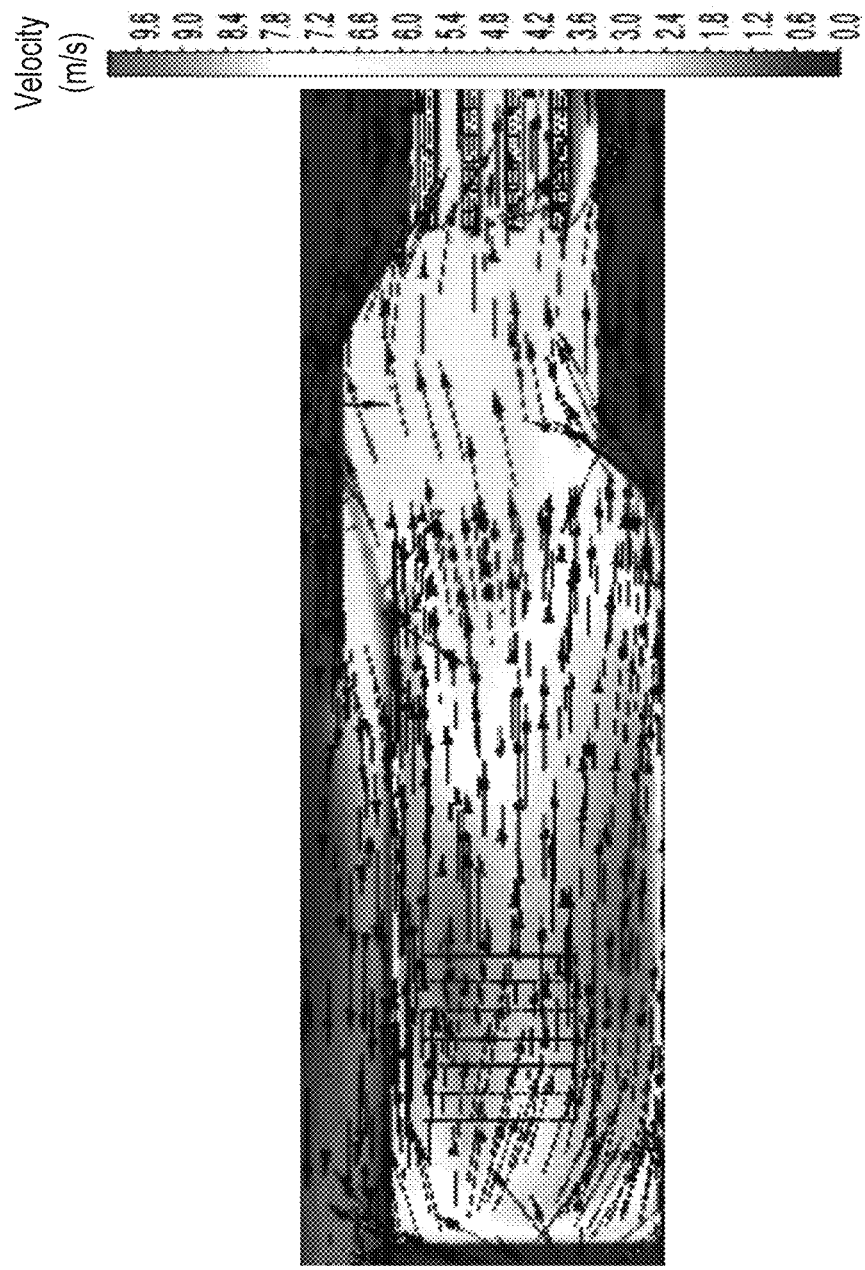
FIGS. 10A, 10B and 10C are views for explaining a concept of maximizing air blowing efficiency of an induction heating device according to an embodiment.
Figure 10A:
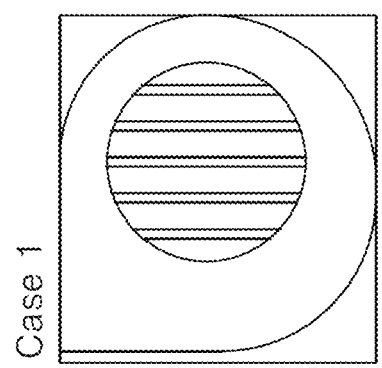
Figure 10B:
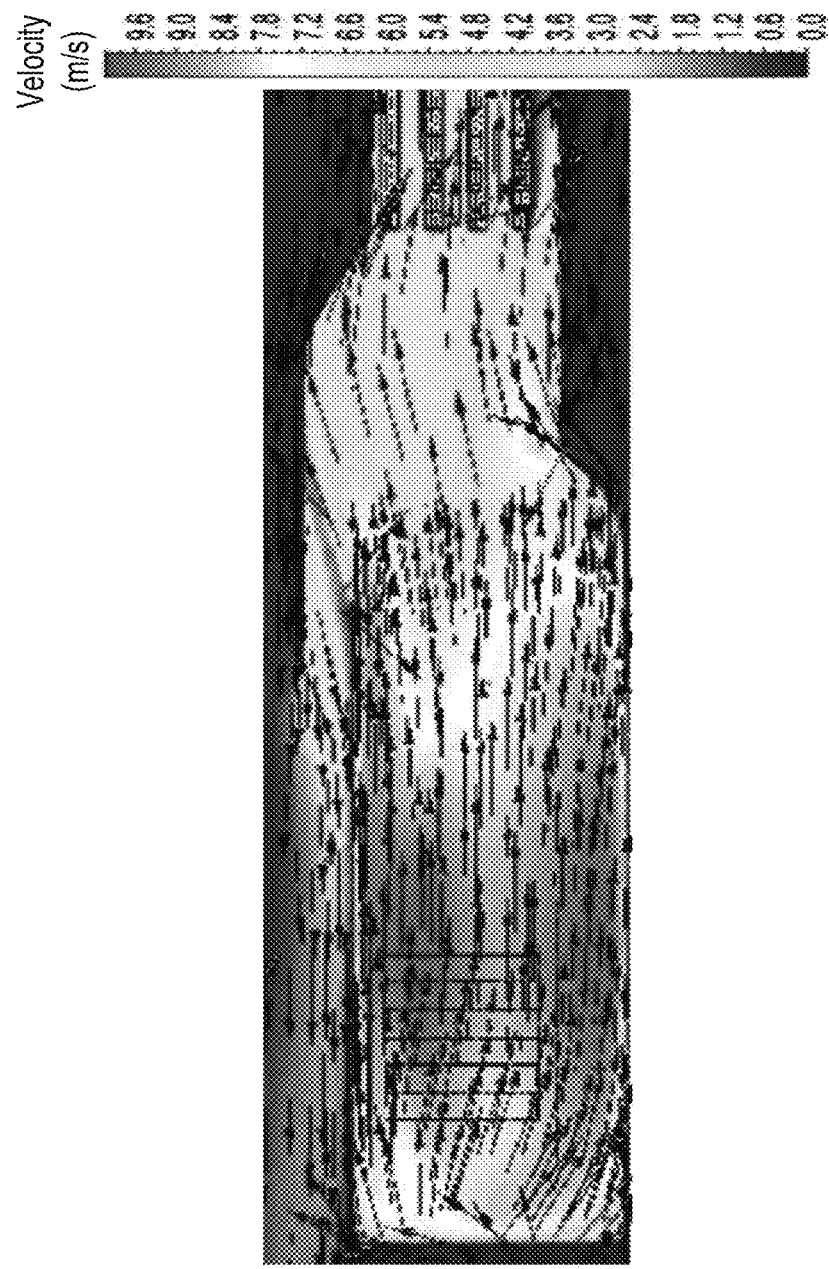
Figure 10B:
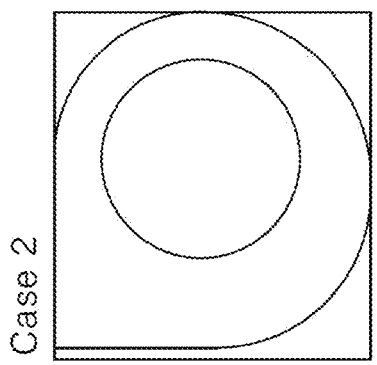
Figure 10C:
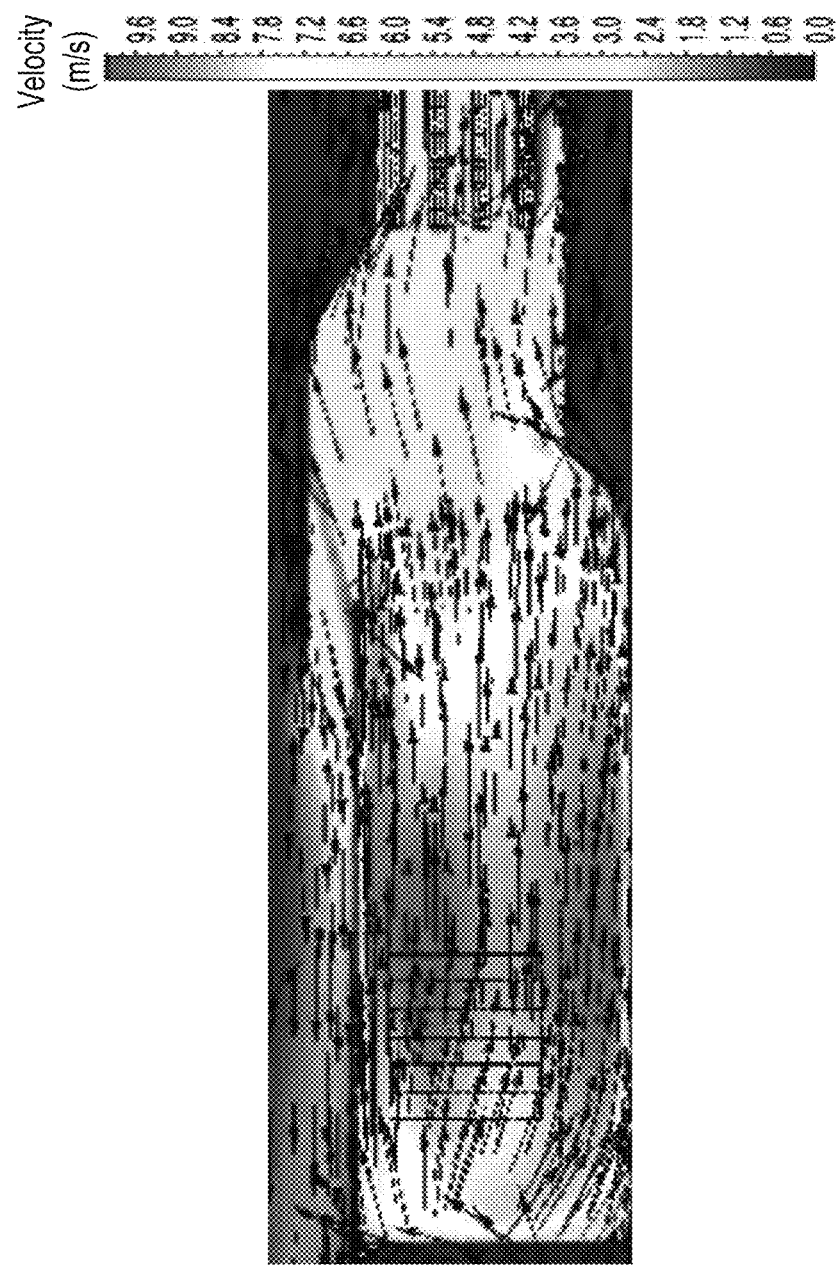
Figure 10C:
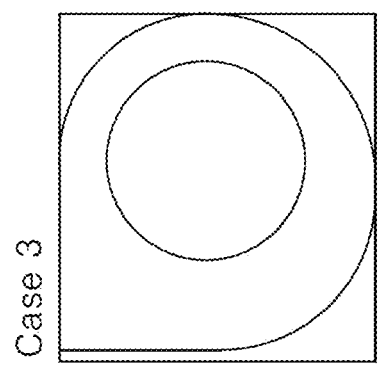

In Table 1 and FIGS. 10A, 10B and 10C, case 1 shows that a through hole including a structure configured to prevent contact of a foreign substance is formed on the lower surface of case 102 without first cover 122a connected to the lower surface of the case 102, case 2 shows that first through holes 1023a, 1023b, 1023c are formed on the lower surface of case 102 and that first cover 122a having a height of 6 mm is connected to the lower surface of the case 102, and case 3 shows that first through holes 1023a, 1023b, 1023c are formed on the lower surface of case 102 and that first cover 122a having a height of 12 mm is connected to the lower surface of the case 102. Additionally, FIGS. 10A, 10B and 10C show air flow in air guides 120a, 120b, 120c.

TABLE 1

|  |  | Case 1 | Case 2 | Case 3 |
|---|---|---|---|---|
| Flow rate of output end of air blowing fan (g/s) | Left | 4.85 | 5.36 | 5.49 |
|  | Center | 4.90 | 5.33 | 5.46 |
|  | Right | 4.92 | 5.45 | 5.61 |
| Flow rate of other end of air guide (g/s) | Left | 3.61 | 4.00 | 4.11 |
|  | Center | 3.66 | 4.00 | 4.09 |
|  | Right | 3.62 | 4.00 | 4.15 |

Referring to Table 1 and FIGS. 10A, 10B and 10C, in case 3, a flow rate of an output end of the air blowing fans 118a, 118b, 118c and a flow rate of the other end of the air guides 120a, 120b, 120c connected to the second through holes are maximized. Accordingly, when cover 122a, 122b having a relatively great height is used, air blowing efficiency may be maximized.

Additionally, in the induction heating device 100 according to embodiments disclosed herein, the plurality of slits 1224a, 1224b formed at the cover 122a, 122b may substitute for a grill formed in the air blowing fan in the induction heating device of the related art. That is, the plurality of slits 1224a, 1224b formed at the cover 122a, 122b may have a width less than a width of a user's finger, and a user's finger may not come into contact with the air blowing fans 118a, 118b, 118c. Accordingly, the induction heating device 100 according to embodiments disclosed herein may meet safety standards. That is, the induction heating device 100 may pass a finger test.

Further, the cover 122a, 122b having a predetermined height may be disposed outside of the lower surface of the case 102. The cover 122a, 122b may be made of a metallic material, such as aluminum, and the slit portion 1221a, 1221b may be disposed to face the lower surface of the case 102 through the extended portions 1222a, 1222b and the bent portions 1223a, 1223b. Accordingly, the material and height of the cover 122a, 122b may help complement rigidity of the lower surface of the case 102 and prevent the sagging of the lower surface of the case 102.

Figure 11A:
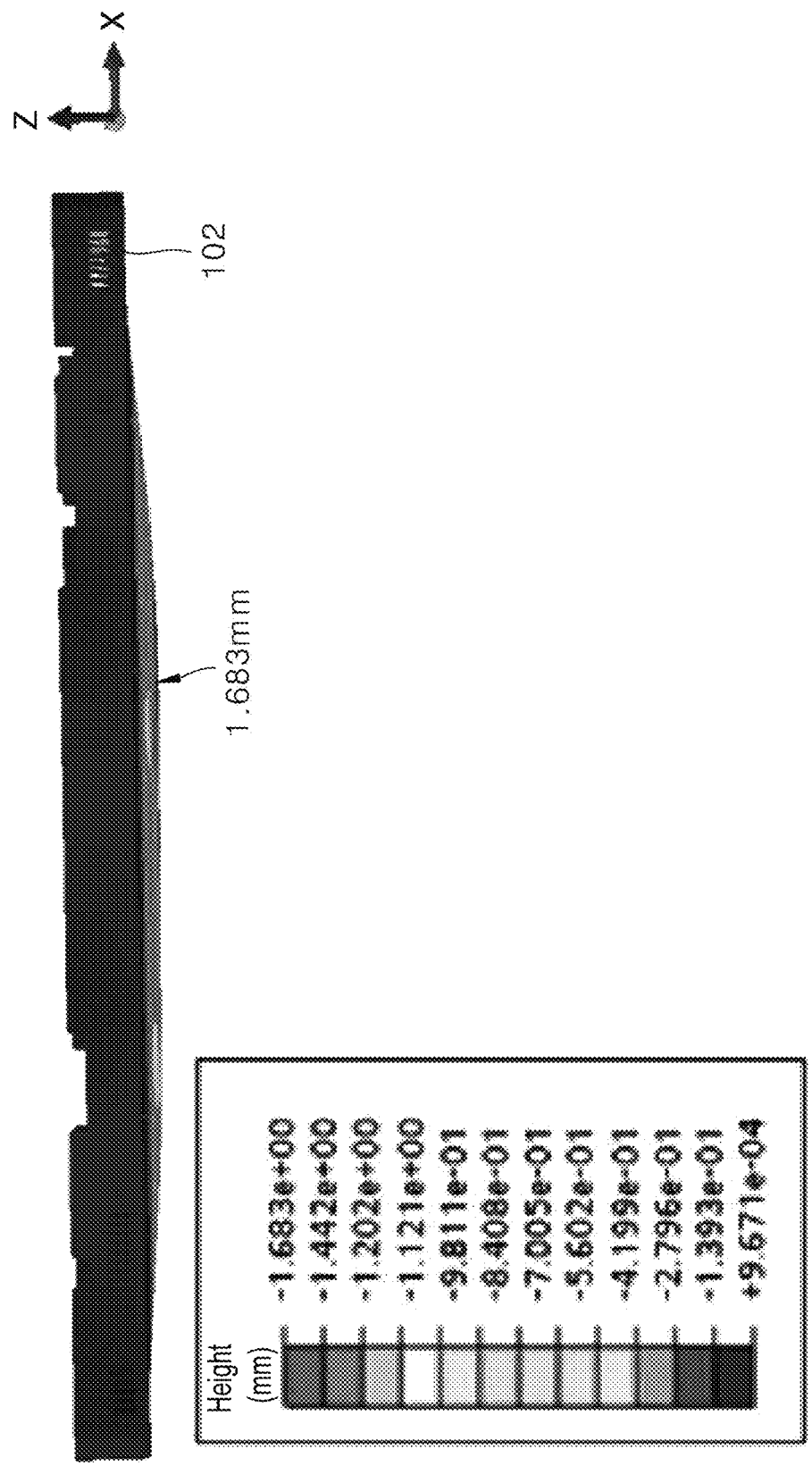
Figure 11B:
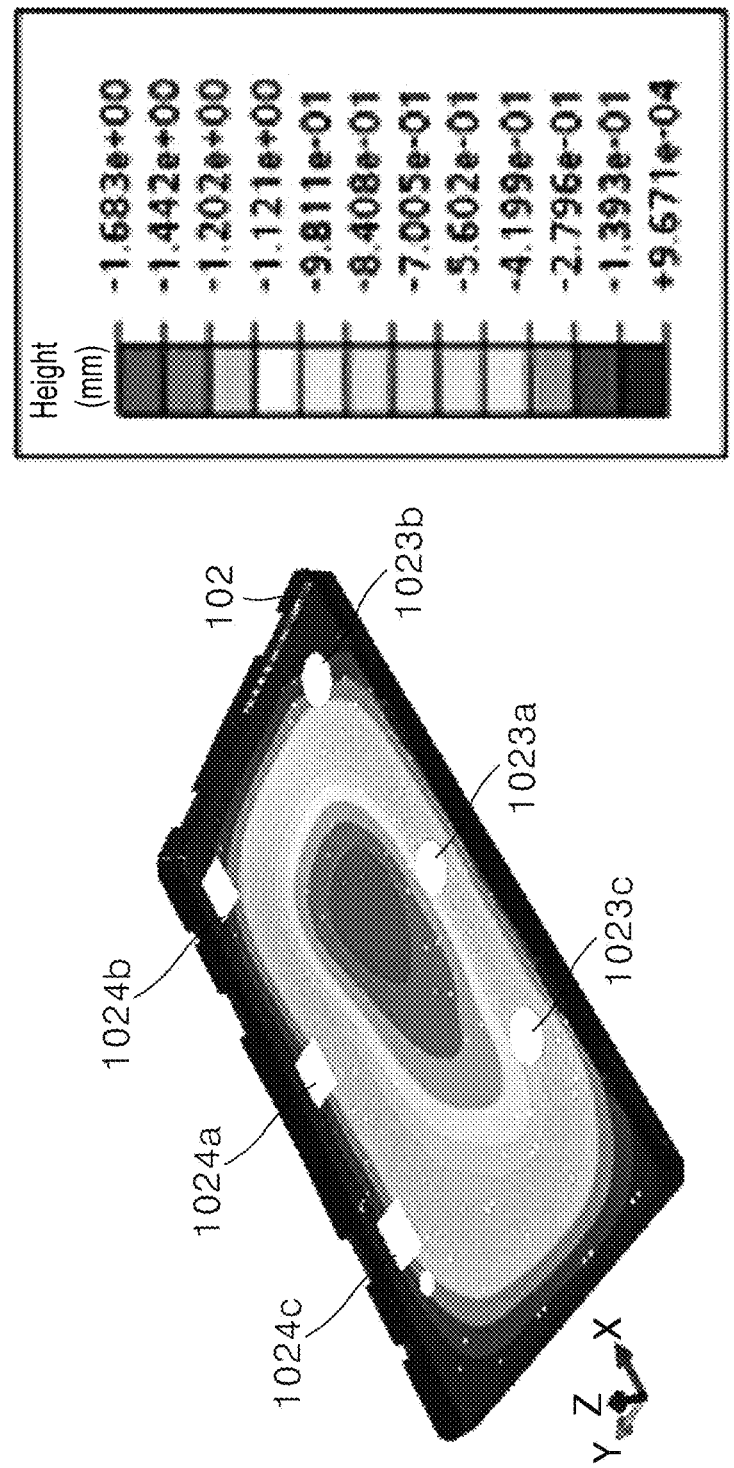
Figure 12B:
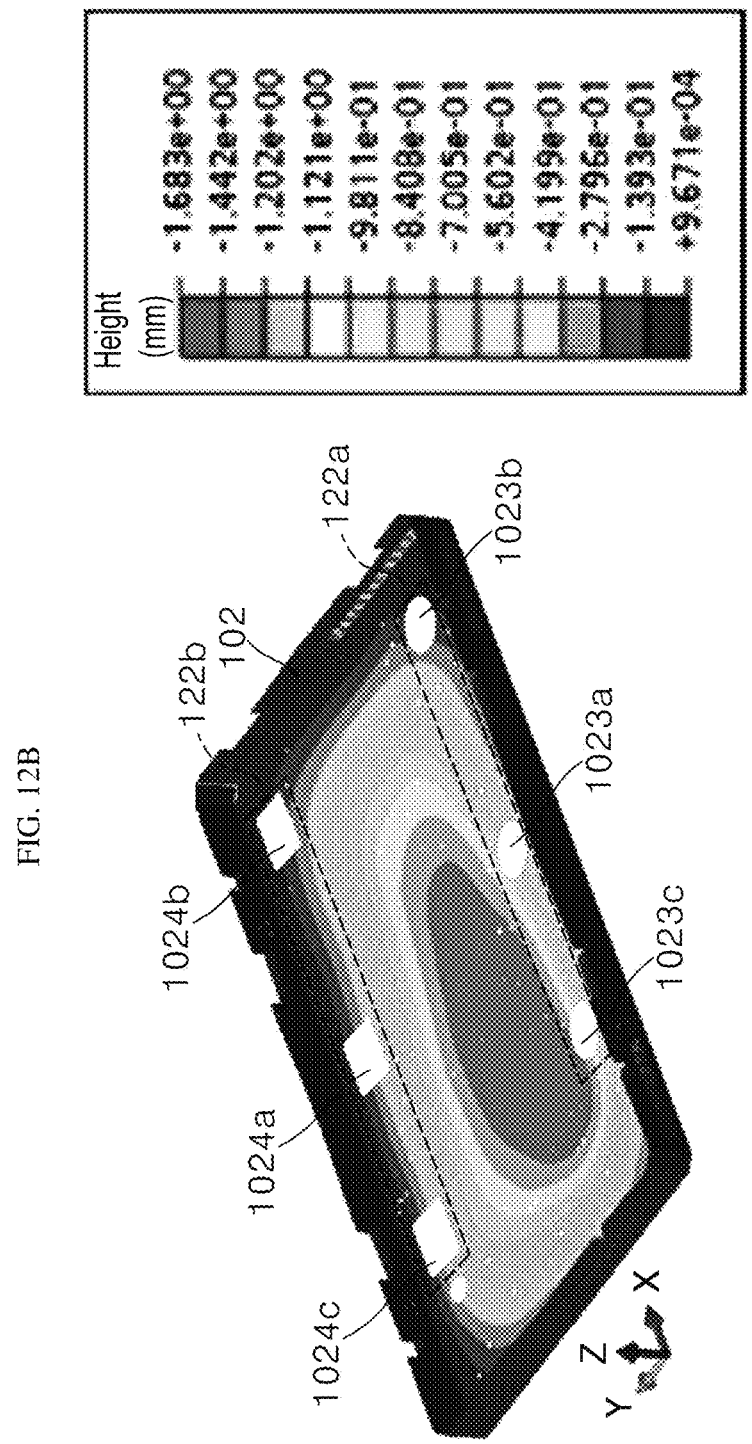

FIGS. 11A, 11B, 12A, 12B and 13 are views for explaining sagging of a lower surface of case 102 depending on whether cover 122a, 122b is provided, according to an embodiment. More specifically, FIGS. 11A and 11B show sagging of the lower surface of case 102 when the cover 122a, 122b is not provided, that is, mounted to, the lower surface of the case 102. FIGS. 12A and 12B show sagging of the lower surface of case 102 when cover 122a, 122b is provided outside of the lower surface of the case 102. FIG. 13 shows a graph regarding a sagging degree of the lower surface of the case 102 depending on a load and whether the cover 122a, 122b is provided.

Referring to FIGS. 11A and 11B, the drive circuit 110a, 110b, 110c and the heat sink 112a, 112b, 112c, for example, may be disposed between the first through hole 1023a, 1023b, 1023c and the second through hole 1024a, 1024b, 1024c. Accordingly, a point between the first through hole 1023a, 1023b, 1023c and the second through hole 1024a, 1024b, 1024c sags by 1.683 mm due to weight of the drive circuit 110a, 110b, 110c and the heat sink 112a, 112b, 112c, for example.

Referring to FIGS. 12A and 12B, the first cover 122a may be disposed outside of the lower surface of the case 102, where the first through hole 1023a, 1023b, 1023c is formed, and the second cover 122b may be disposed outside of the lower surface of the case 102, where the second through hole 1024a, 1024b, 1024c is formed. The first cover 122a and the second cover 122b may complement or improve rigidity of the lower surface of the case 102. Accordingly, a point between the first through hole 1023a, 1023b, 1023c and the second through hole 1024a, 1024b, 1024c sags by 1.376 mm.

Thus, the lower surface of the case 102 according to embodiments disclosed herein may be further complemented or improved in rigidity and may sag less than the lower surface of the case 102 having no cover 122a, 122b disposed outside of the lower surface of the case 102.

Embodiments disclosed herein relate to an electric range that may prevent noise generated in the device. Embodiments disclosed herein further relate to an electric range that may maximize air blowing efficiency.

Embodiments disclosed herein also relate to an electric range that may meet safety standards. Embodiments disclosed herein additionally relate to an electric range that may prevent a sagging of a lower surface of a case.

Advantages are not limited to the ones discussed above, and other advantages that are not mentioned above can be clearly understood from the description and can be more clearly understood from the embodiments set forth herein.

One or more of these advantages are solved by the claimed features.

An electric range according to embodiments disclosed herein may supply and discharge air through a plurality of through holes formed on a lower surface of a case, thereby making it possible to maximize air blowing efficiency. The electric range may include a cover having a plurality of slits and disposed outside of a lower end surface of the case in a way that encircles the plurality of through holes, thereby making it possible to meet safety standards of the device. The electric range may include a first cover and a second cover that are disposed outside of the lower end surface of the case to face each other, thereby making it possible to complement or improve rigidity of the lower surface of the case and prevent bending (sagging) of the lower surface of the case. The electric range may employ an air blowing fan (fan) with no structure for preventing contact of a foreign substance, thereby making it possible to reduce noise generated during driving of the electric range.

According to embodiments disclosed herein, an electric range is provided that may include a case; an air blowing fan configured to cool an inside of the case; a first through hole formed on a lower surface of the case and configured to supply air to the air blowing fan; and a first cover disposed to encircle the first through hole outside the lower surface of the case and having a plurality of first slits. At least one heating unit may be accommodated in the case.

According to embodiments disclosed herein, an electric range is provided that may include a case; a cover plate coupled to an upper end of the case and allowing an object to be heated to be placed on an upper surface thereof; a plurality of heating units disposed at a lower end of the cover plate and configured to heat the object to be heated; a drive circuit configured to control an operation of the plurality of heating units; at least one air blowing fan configured to cool the drive circuit; at least one first through hole formed on a lower surface of the case and configured to supply air respectively to the at least one air blowing fan; at least one second through hole formed on the lower surface of the case and configured to discharge air in the case out of the case; a first cover disposed to encircle the at least one first through hole outside the lower surface of the case and having a plurality of first slits; and a second cover disposed to encircle the at least one second through hole outside the lower surface of the case and having a plurality of second slits.

According to embodiments disclosed herein, an electric range is provided that may include a case that accommodates a heating unit configured to heat an object; an air blowing fan configured to cool an inside of the case; a first through hole formed in the case, in particular, in a lower surface thereof, to supply air to the air blowing fan; and a first cover mounted on the case to cover the first through hole and including a first slit portion having a plurality of first slits. The first through hole may be formed in a bottom surface or lower surface of the case. The first cover may be mounted on an outside of the case and/or on the bottom surface or lower surface of the case.

The electric range according to embodiments disclosed herein may include any one or more of the following features:

The air blowing fan may be accommodated in the case. The air blowing fan may be a fan without a grill.

The plurality of first slits may be configured to prevent a foreign substance from contacting the air blowing fan.

The plurality of first slits may be formed in a first slit portion of the first cover. The first slit portion may extend in a plane parallel to a surface of the case having the first through hole, for example, to the bottom surface or lower surface of the case.

The first through hole may be formed at a lower end of, for example, below, the air blowing fan. A shape or size of the first through hole may correspond to a shape or size of the air blowing fan, in particular, of a lower surface of the air blowing fan.

A plurality of air blowing fans and first through holes may be provided. The plurality of first through holes may be disposed along a line and/or side by side at an edge of the case, in particular, at an edge of one side of the lower surface of the case. That is, the plurality of first through holes may be disposed one next to the other along an edge of the case, in particular, along a front edge or a rear edge of the case. The first cover may be disposed to encircle, that is, cover, the plurality of first through holes.

The first cover may include a first slit portion having the plurality of first slits. The first cover may include a plurality of first extended portions that extends from a plurality of ends or edges of the first slit portion in a heightwise, that is, a vertical direction. The first extended portions may be inclined to, that is, form an angle (such as 90°) with, the first slit portion. The first extended portions may extend from the first slit portion towards the case. Thus, the first slit portion may be spaced from the case. The first extended portions may define a height of the first cover. The first cover may include a plurality of first bent portions bent at each of the plurality of first extended portions. The bent portions may extend in parallel to a surface, for example, the lower surface, of the case to which the first cover is mounted and/or in which the first through hole is formed.

The first slit portion may be disposed to face the lower surface of the case. The plurality of first bent portions may be screw-coupled to the lower surface of the case.

The electric range may further include a second through hole formed in the case, for example, on the bottom surface or lower surface of the case, and configured to discharge air in the case out of the case. In this case, the electric range may further include a second cover mounted on the case and covering the second through holes. That is, the second cover may be disposed to encircle the second through hole outside the lower surface of the case and having a plurality of second slits. The second cover may have the same configuration as the first cover.

The electric range may further include an air guide configured to guide air generated by the air blowing fan. One (first) end of the air guide may be adjacent to the air blowing fan. The other (second) end of the air guide may be connected to the second through hole. A shape of the second through hole may correspond to a shape of the other end of the air guide.

A plurality of second through holes may be provided. The plurality of second through holes may be disposed side by side at an edge of the other side of the lower surface of the case. The second cover may be disposed to encircle the plurality of second through holes.

The second cover may include a second slit portion having the plurality of second slits. The second slit portion may extend in a plane parallel to a surface of the case having the second through hole, that is, to the bottom surface or lower surface of the case. The second cover may include a plurality of second extended portions that extends from a plurality of edges or ends of the second slit portion in a heightwise, that is, vertical, direction. The second extended portions may be inclined to, for example, form an angle (such as 90°) with, the second slit portion. The second extended portions may extend from the second slit portion towards the case. Thus, the second slit portion may be spaced from the case. The second extended portions may define a height of the second cover. The second cover may include a plurality of second bent portions bent respectively at the plurality of second extended portions. The second bent portions may extend in parallel to a surface, for example, the lower surface, of the case to which the second cover may be mounted and/or in which the second through hole may be formed.

The second slit portion may be disposed to face the lower surface of the case. The plurality of second bent portions may be screw-coupled to the lower surface of the case.

The first cover may be disposed on an edge of one (first) side of the lower surface of the case and the second cover may be disposed at an edge of the other (second) side of the lower surface of the case. Thus, the first cover and the second cover may be disposed to face each other.

A height of the first cover may be the same as a height of the second cover, that is, in a vertical direction. The first cover and the second cover may be configured to complement rigidity of the lower surface of the case and/or to prevent sagging of the lower surface of the case.

The electric range may be an electric resistance-type electric range or an induction heating-type electric range. Directional indication, such as height, heightwise or vertical direction, width, upper end, and lower end, for example, refer to an orientation when the electric range is in its operative state or position. In particular, a heightwise direction may also be referred to as a vertical direction. Width may denote a dimension in a horizontal direction, in particular, in a horizontal direction parallel to a (vertical) front surface of the case of the electric range which will be facing a user during operation. Thus, left end and right end may denote respectively a first lateral end and a second lateral end with respect to an operative state or position of the electric range. Likewise a front end may denote an end that is closer to a user when operating the electric range, while a rear end may denote an end that is farther from a user when operating the electric range.

According to embodiments disclosed herein, a grill in an air blowing fan of the related art may be removed to reduce noise and maximize air blow efficiency. Further, according to embodiments disclosed herein, a cover having slits through which air passes may be disposed on the lower surface of the case to meet safety standards of the electric range. One or more covers may prevent sagging of the lower surface of the case caused due to weight of the case.

Embodiments are described above with reference to a number of illustrative embodiments thereof. However, the embodiments are not intended to be limited to the embodiments and drawings set forth herein, and numerous other modifications and embodiments can be devised by one skilled in the art without departing from the technical. Further, effects and predictable effects based on configurations in the disclosure are to be included within the range of the disclosure though not explicitly described in the description of embodiments.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present disclosure.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electric range, comprising:
   a case comprising a cover plate, and housing a plurality of heating coils;
   a plurality of fans located in the case and configured to cool an inside of the case;
   a plurality of first through holes formed on a first side of a lower surface of the case and disposed side by side along an edge of the case to supply air to the plurality of fans;
   a plurality of second through holes formed on a second side of the lower surface of the case and disposed side by side at an edge of the second side of the case to discharge air out of the case;
   a first cover disposed to encircle the plurality of first through holes outside of the lower surface of the case and having a plurality of first slits;
   a second cover disposed to encircle the plurality of second through holes outside of the lower surface of the case and having a plurality of second slits, wherein the first cover and the second cover face each other; and
   a plurality of air guides configured to guide air generated by the plurality of fans, wherein a first end of each of the plurality of air guides is adjacent to each of the plurality of fans, and a second end of the plurality of air guides is connected to each of the plurality of second through holes, and wherein a shape of each of the plurality of second through holes corresponds to a shape of the second end of each of the plurality of air guides.

2. The electric range of claim 1, wherein the first cover prevents a foreign substance from contacting the plurality of fans.

3. The electric range of claim 2, wherein the plurality of fans has no structure for preventing contact of a foreign substance.

4. The electric range of claim 1, wherein the plurality of first through holes is formed at a lower end of the plurality of fans, and a shape of each of the plurality of first through holes corresponds to a shape of each of a lower surface of the plurality of fans.

5. The electric range of claim 1, wherein the first cover comprises:
   a first slit portion including the plurality of first slits;
   a plurality of first extended portions that extends from a plurality of ends of the first slit portion in a heightwise direction; and
   a plurality of first bent portions bent at each of the plurality of first extended portions.

6. The electric range of claim 5, wherein the first slit portion faces the lower surface of the case, and wherein the plurality of first bent portions is screw-coupled to the lower surface of the case.

7. The electric range of claim 1, wherein the second cover comprises:
   a second slit portion including the plurality of second slits;
   a plurality of second extended portions that extend from a plurality of ends of the second slit portion in a heightwise direction; and
   a plurality of second bent portions bent respectively at the plurality of second extended portions.

8. The electric range of claim 7, wherein the second slit portion faces the lower surface of the case, and wherein the plurality of second bent portions is screw-coupled to the lower surface of the case.

9. The electric range of claim 1, wherein a height of the first cover is the same as a height of the second cover.

10. The electric range of claim 1, wherein the first cover and the second cover increase a rigidity of the lower surface of the case and prevent sagging of the lower surface of the case.

\* \* \* \* \*